(12) United States Patent
Jang et al.

(10) Patent No.: US 11,664,461 B2
(45) Date of Patent: May 30, 2023

(54) OXIDE SEMICONDUCTOR THIN-FILM TRANSISTOR AND METHOD OF FABRICATING THE SAME

(71) Applicant: UNIVERSITY-INDUSTRY COOPERATION GROUP OF KYUNG HEE UNIVERSITY, Yongin-si (KR)

(72) Inventors: Jin Jang, Seoul (KR); Md Mobaidul Islam, Seoul (KR); Ravindra Naik Bukke, Seoul (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 102 days.

(21) Appl. No.: 17/238,346

(22) Filed: Apr. 23, 2021

(65) Prior Publication Data
US 2022/0123147 A1  Apr. 21, 2022

(30) Foreign Application Priority Data
Oct. 21, 2020  (KR) .................. 10-2020-0136986

(51) Int. Cl.
*H01L 27/00* (2006.01)
*H01L 29/00* (2006.01)
(Continued)

(52) U.S. Cl.
CPC .... *H01L 29/7869* (2013.01); *H01L 29/66742* (2013.01); *H01L 29/78618* (2013.01); *H10K 59/124* (2023.02)

(58) Field of Classification Search
CPC ............ H01L 27/3258; H01L 27/1225; H01L 27/1085; H01L 27/10873; H01L 29/7869; H01L 29/66742; H01L 29/78618
See application file for complete search history.

(56) References Cited

U.S. PATENT DOCUMENTS 11,107,927 B2 * 8/2021 Jang .................. H01L 29/78648
2020/0075767 A1 * 3/2020 Jang .................. H01L 29/78648

FOREIGN PATENT DOCUMENTS

CN    111129160      * 12/2019  ................ 29/786
JP    2014-30040 A    2/2014
(Continued)

OTHER PUBLICATIONS

Peixin Zhu et al., "Hybrid cluster precursors of the LaZrO insulator for transistors: lowering the processing temperature", Scientific Reports, Article No. 5934 (2018).
(Continued)

*Primary Examiner* — Nikolay K Yushin
(74) *Attorney, Agent, or Firm* — Sughrue Mion, PLLC

(57) ABSTRACT

The present disclosure discloses an oxide semiconductor thin-film transistor and a method of fabricating the same. According to one embodiment of the present disclosure, the oxide semiconductor thin-film transistor includes a substrate, a gate electrode, a gate insulating layer, an oxide semiconductor layer, and source and drain electrodes. Since the gate insulating layer is formed of at least one of zirconium oxide (ZrOx) and lanthanum zirconium oxide (LaZrOx), the electrical characteristics of the oxide semiconductor thin-film transistor may be controlled by the gate insulating layer.

9 Claims, 29 Drawing Sheets

(51) Int. Cl.
*H01L 29/786* (2006.01)
*H01L 29/66* (2006.01)

(56) References Cited

FOREIGN PATENT DOCUMENTS

| | | | | |
|---|---|---|---|---|
| JP | 5999525 B2 | 9/2016 | | |
| KR | 20120004786 | * 10/2012 | ......... | H01L 27/1225 |
| KR | 10-2014-0083736 A | 7/2014 | | |
| KR | 10-2015-0054422 A | 5/2015 | | |
| KR | 10-2016-0067166 A | 6/2016 | | |
| KR | 10-2020-0065791 A | 6/2020 | | |
| WO | WO2018/084421 | * 11/2018 | ........... | H01L 29/786 |

OTHER PUBLICATIONS

Communication dated Nov. 22, 2021, issued by the Korean Patent Office in counterpart Korean Application No. 10-2020-0136986.
Communication dated Apr. 26, 2022, issued by the Korean Patent Office in counterpart Korean Application No. 10-2020-0136986.

* cited by examiner

[FIG. 1A]
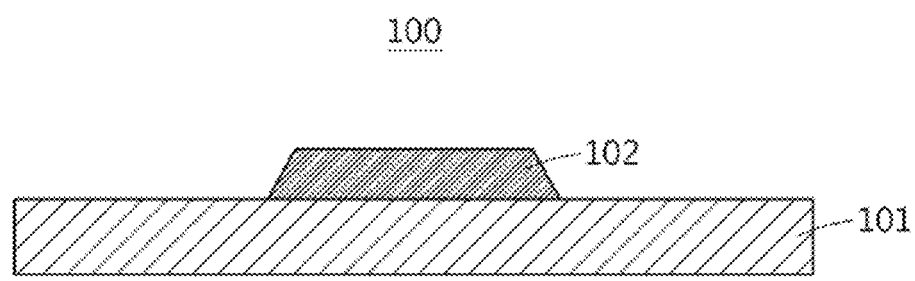
[FIG. 1B]
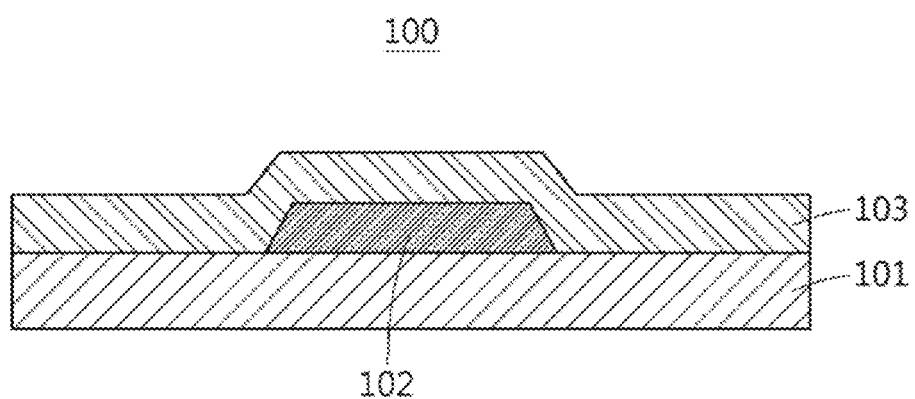

[FIG. 1C]
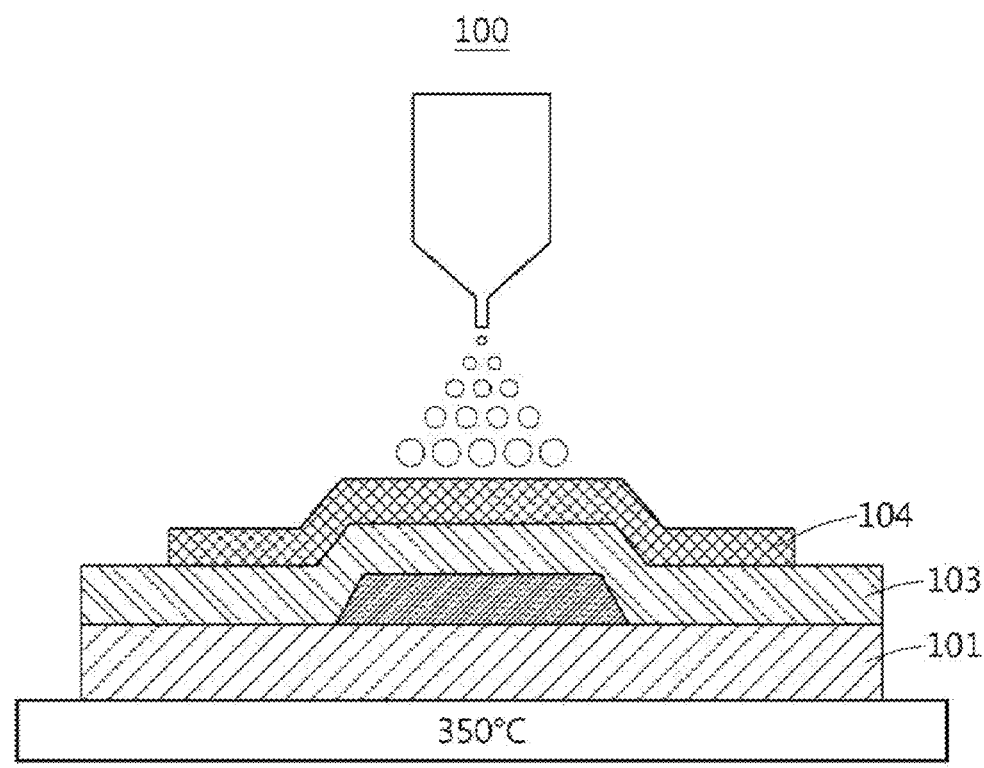
[FIG. 1D]
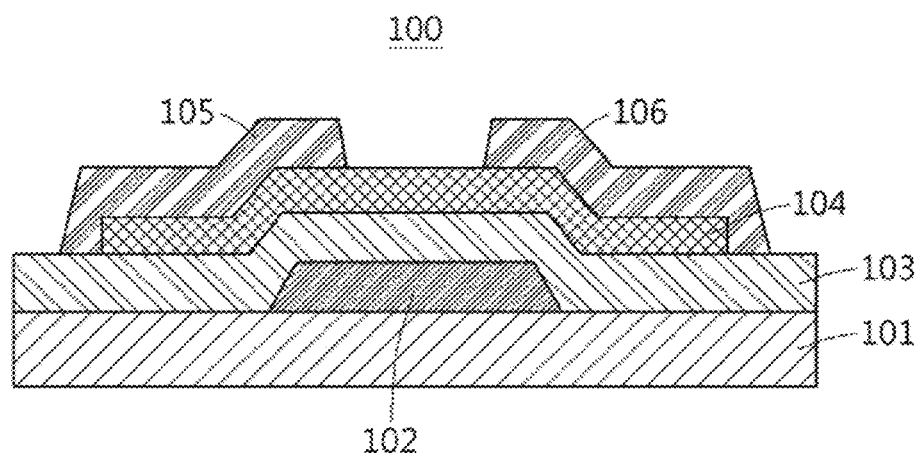

[FIG. 2]
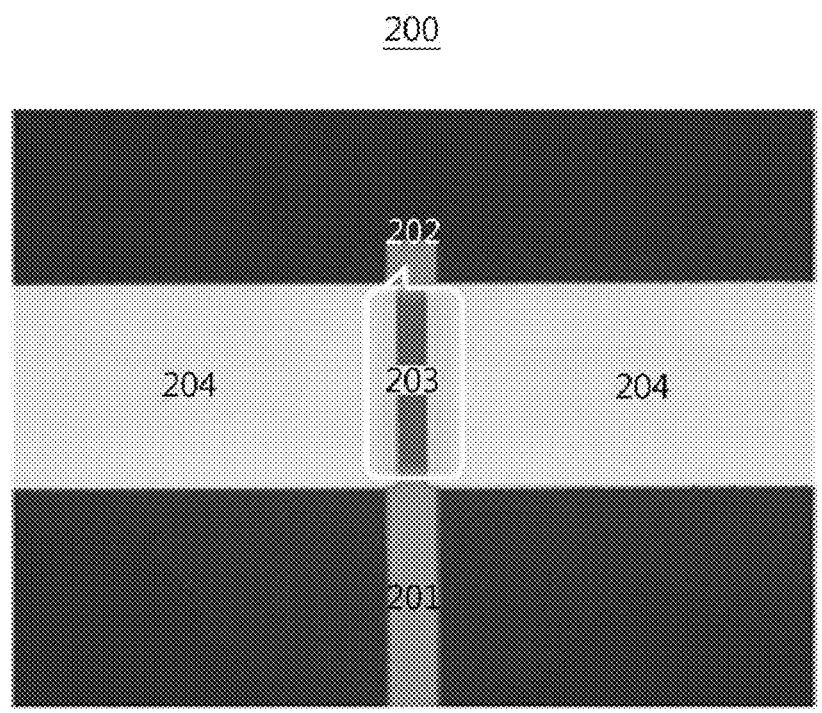

[FIG. 3A]
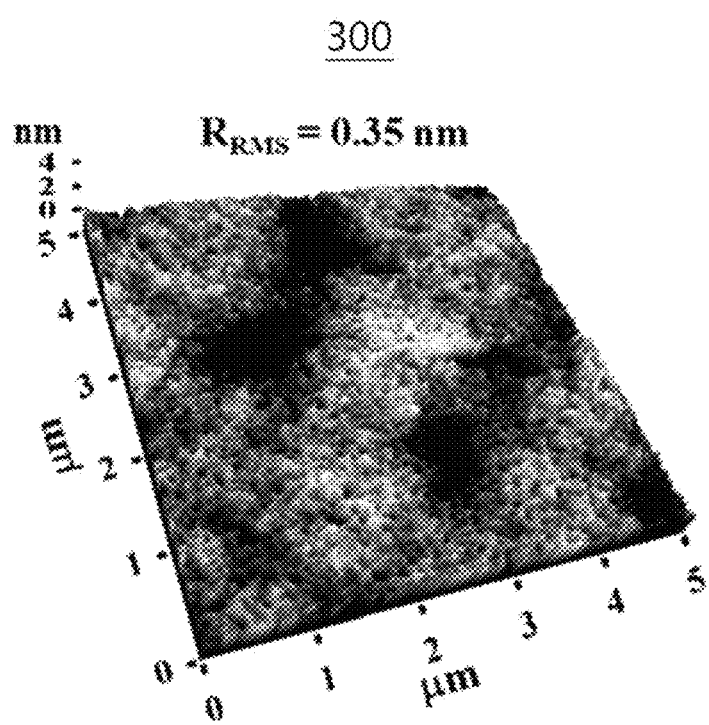

[FIG. 3B]
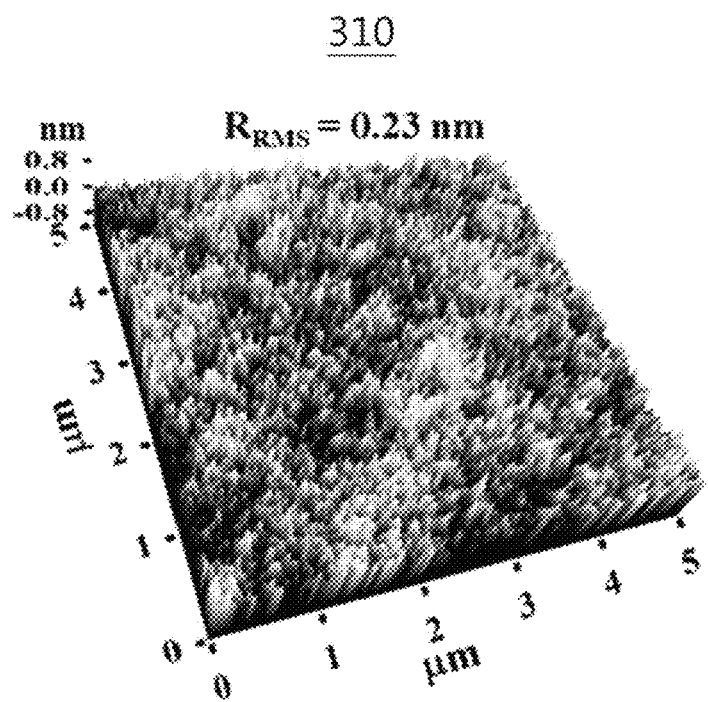
[FIG. 3C]
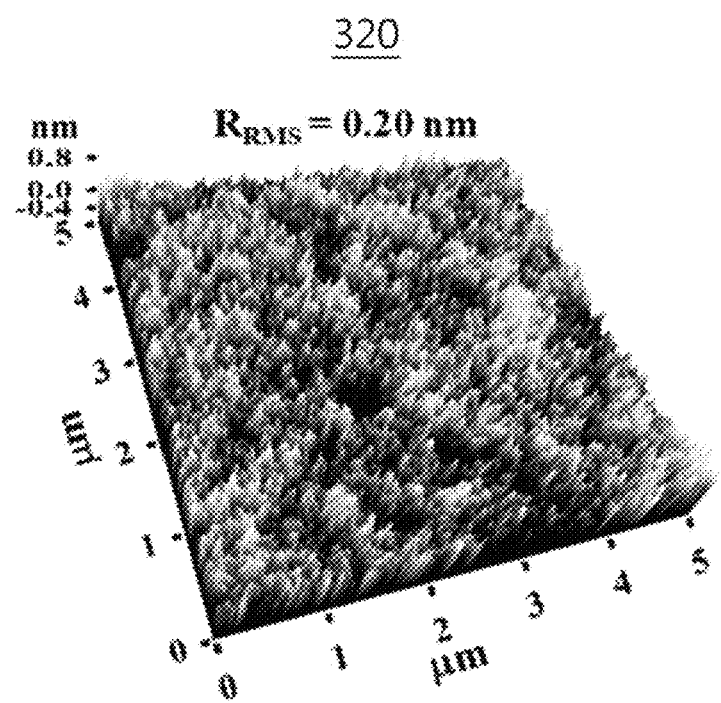

[FIG. 3D]
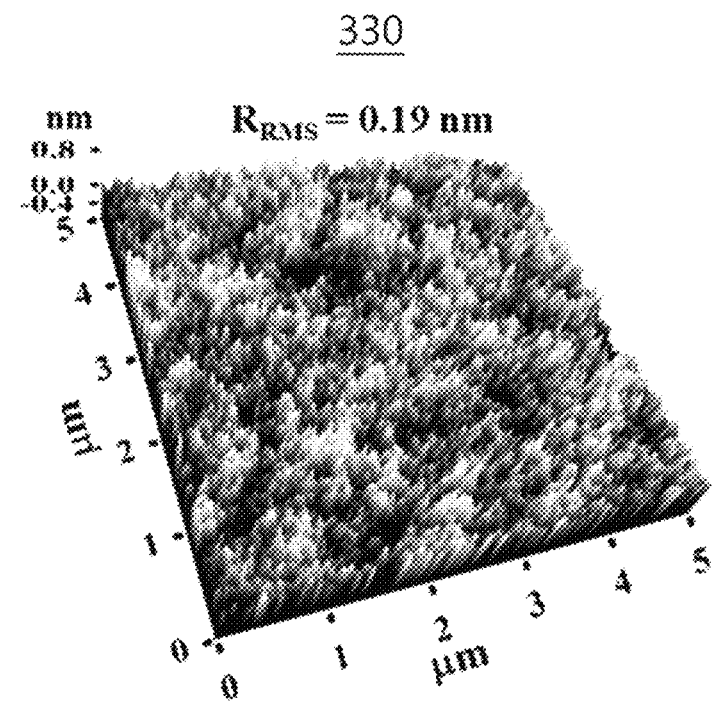

[FIG. 4A]
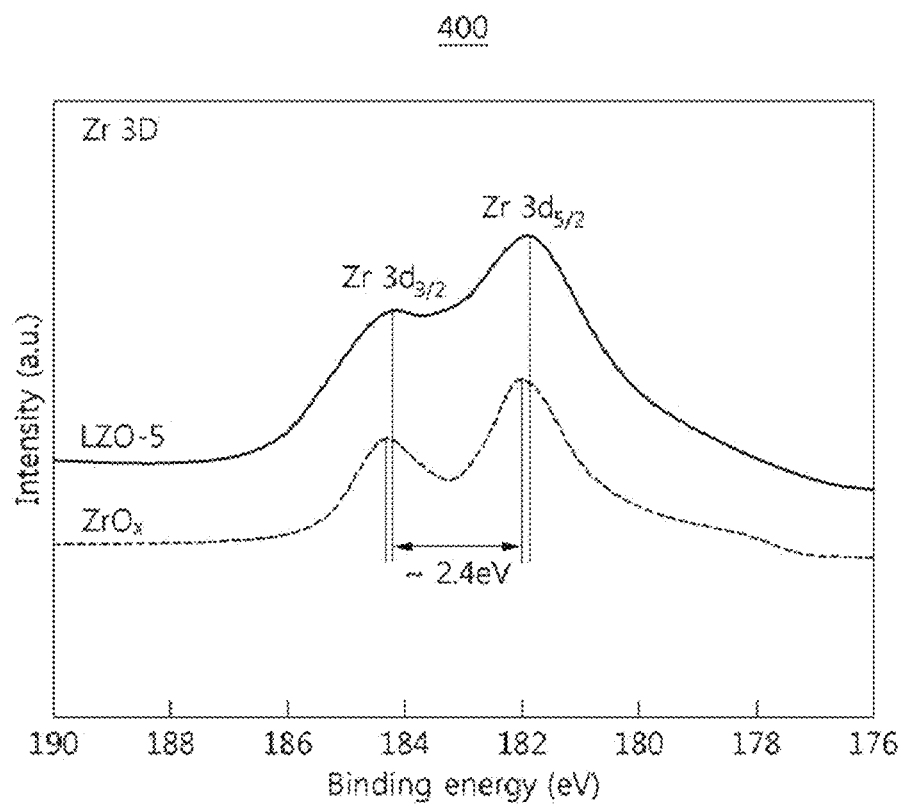

[FIG. 4B]
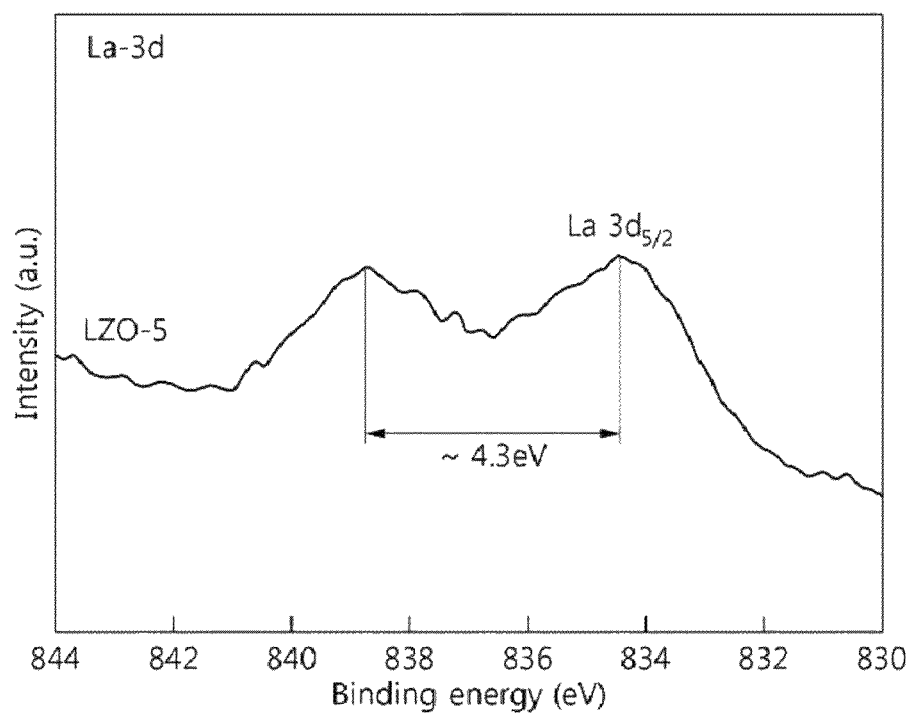

[FIG. 4C]
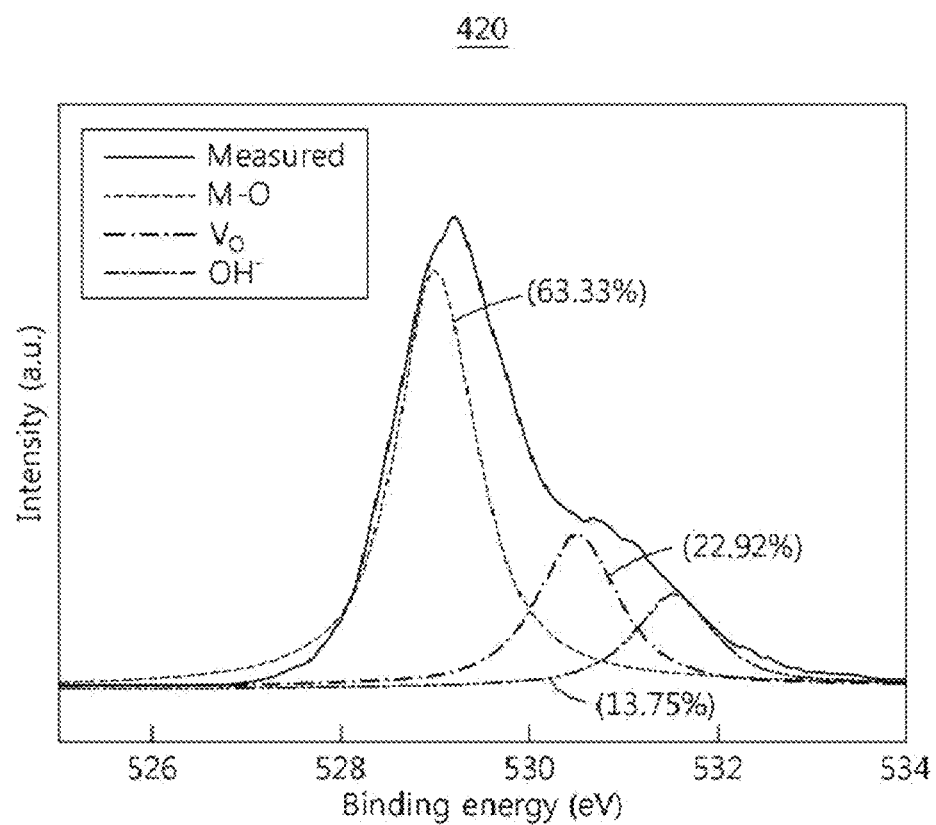

[FIG. 4D]
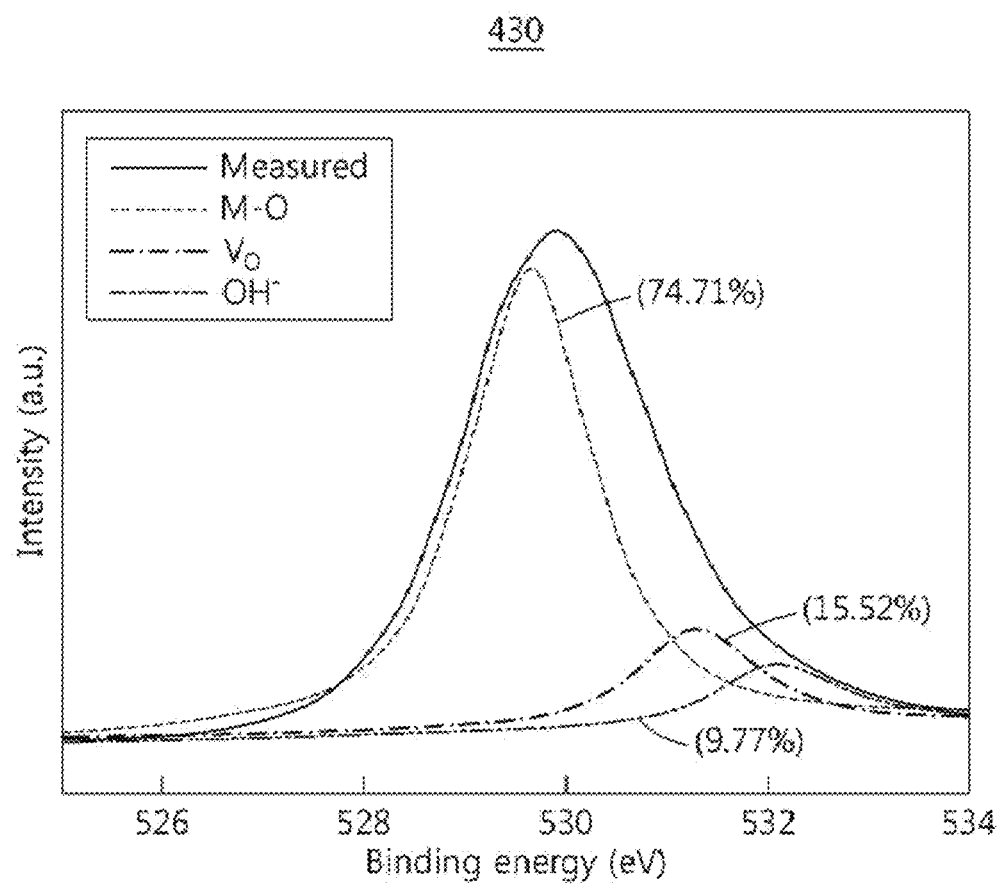

[FIG. 5A]
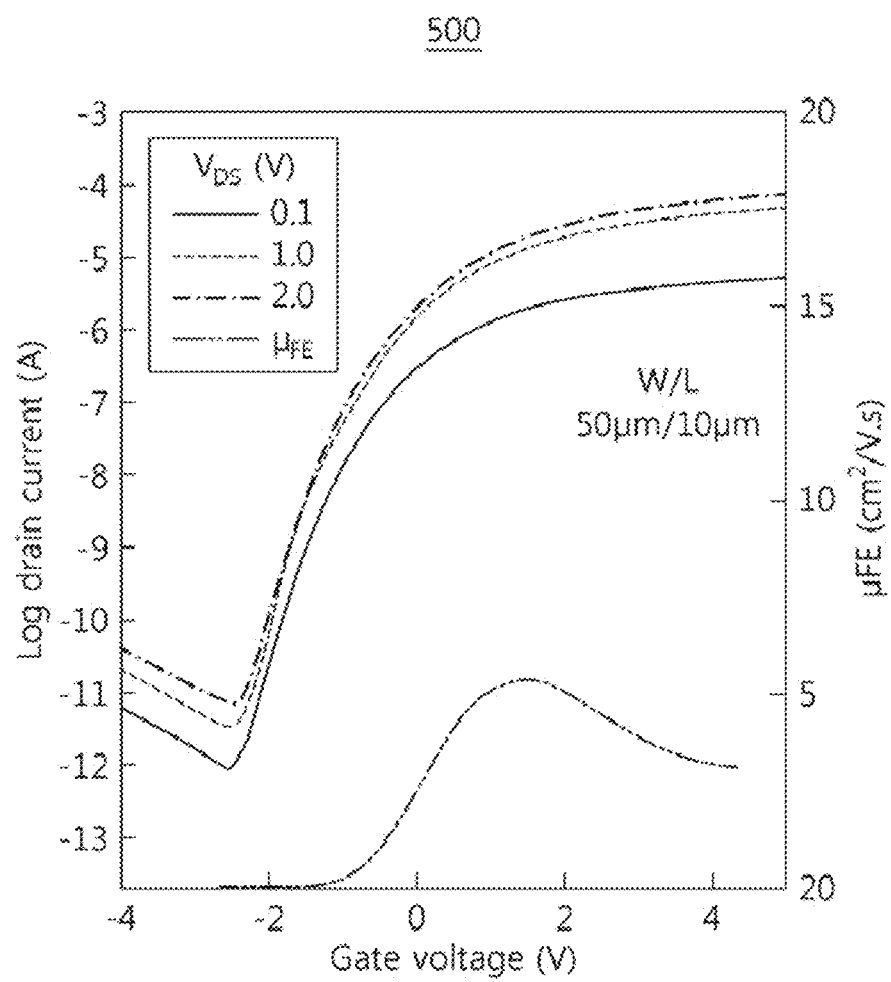

[FIG. 5B]
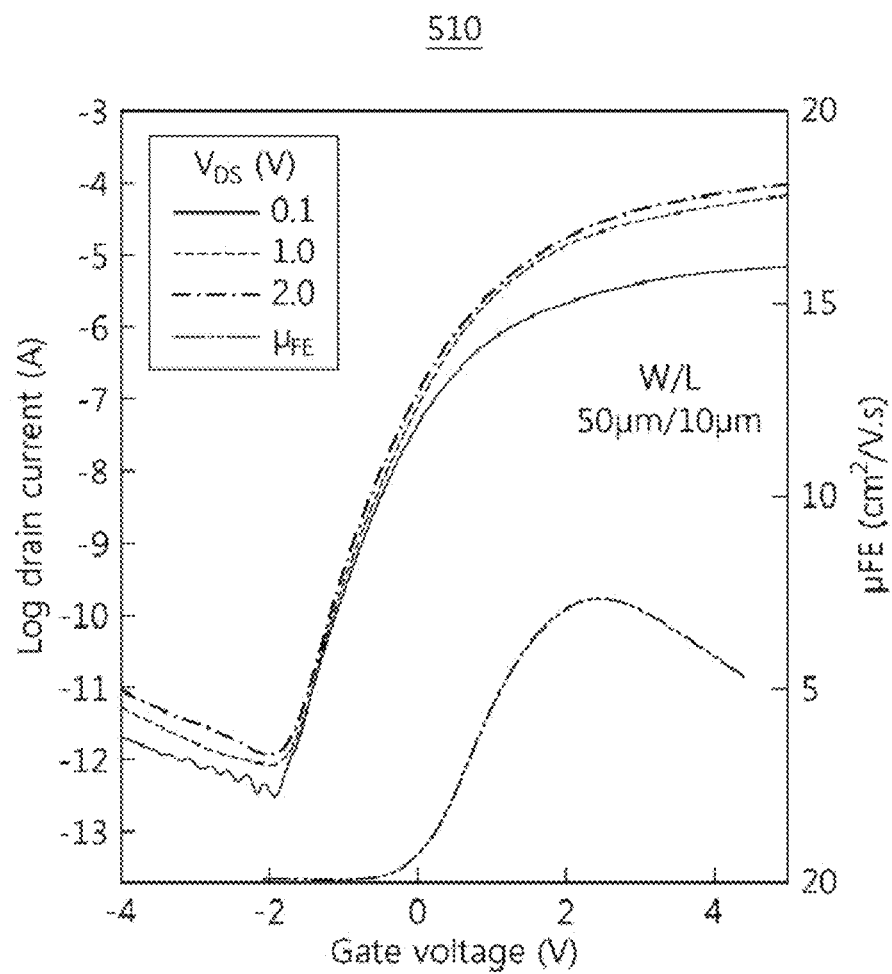

[FIG. 5C]
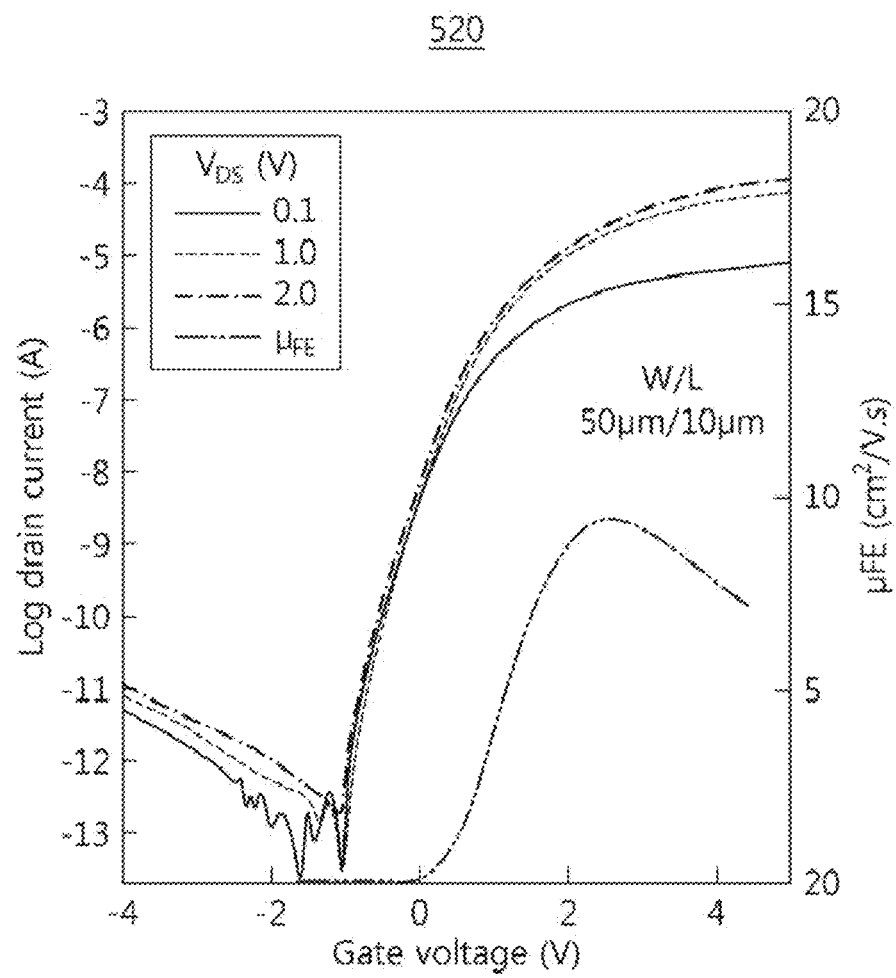

[FIG. 5D]
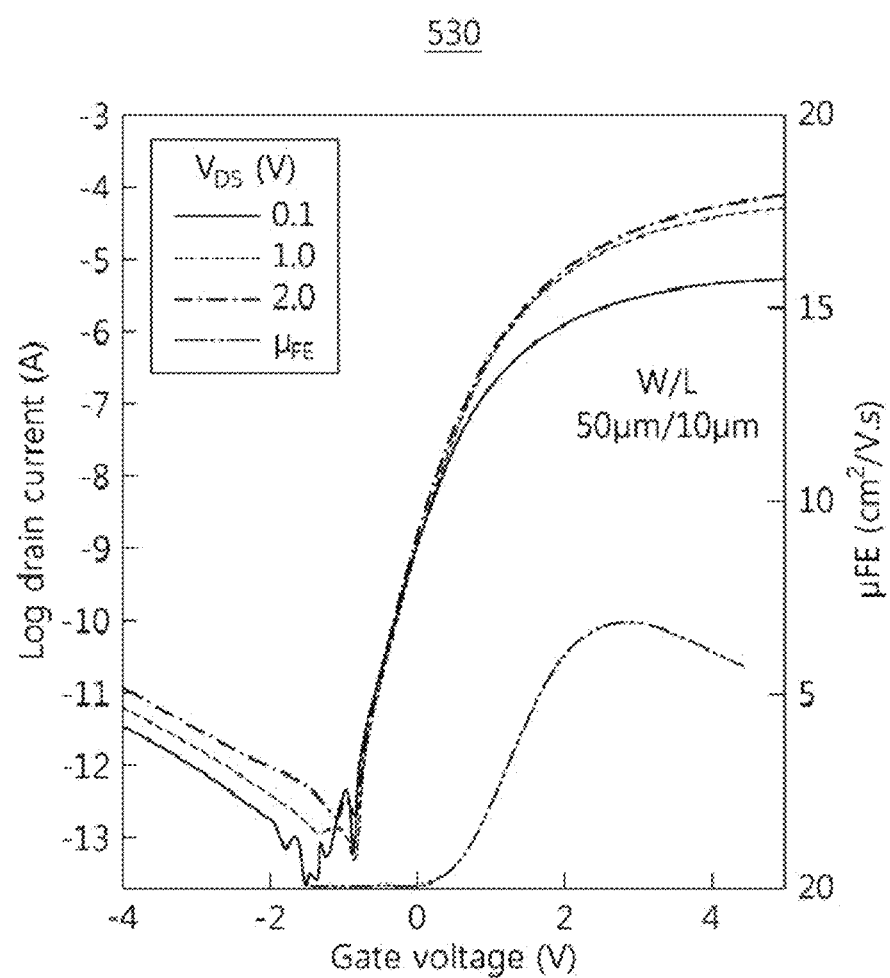

[FIG. 6A]
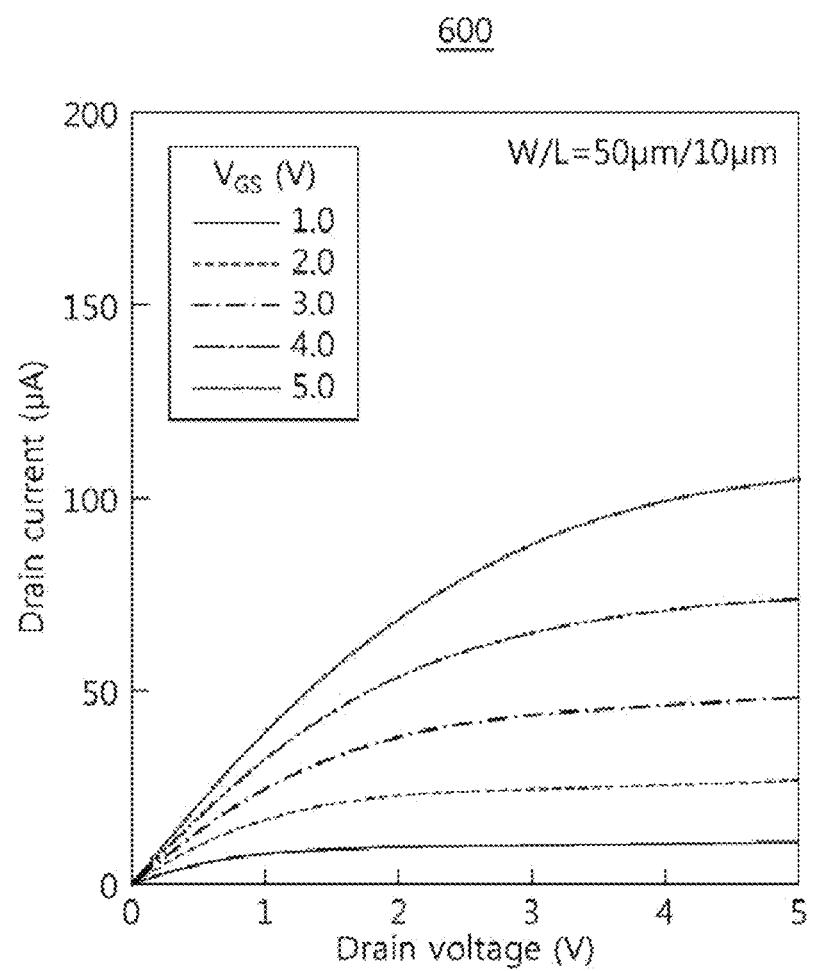

[FIG. 6B]
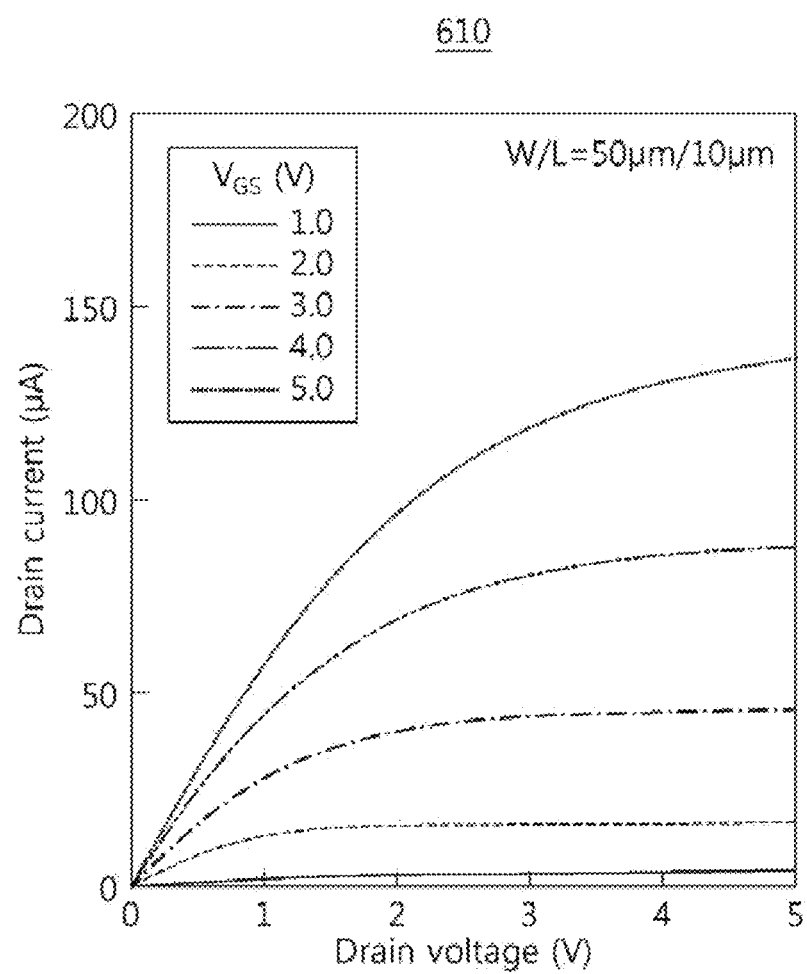

[FIG. 6C]
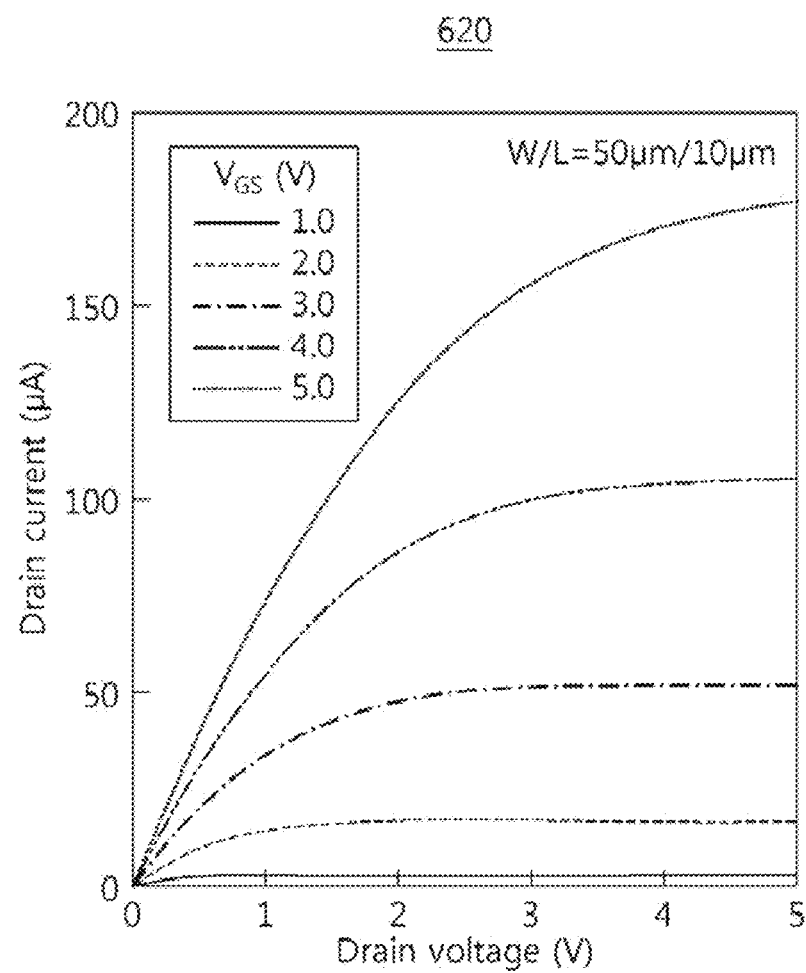

[FIG. 6D]
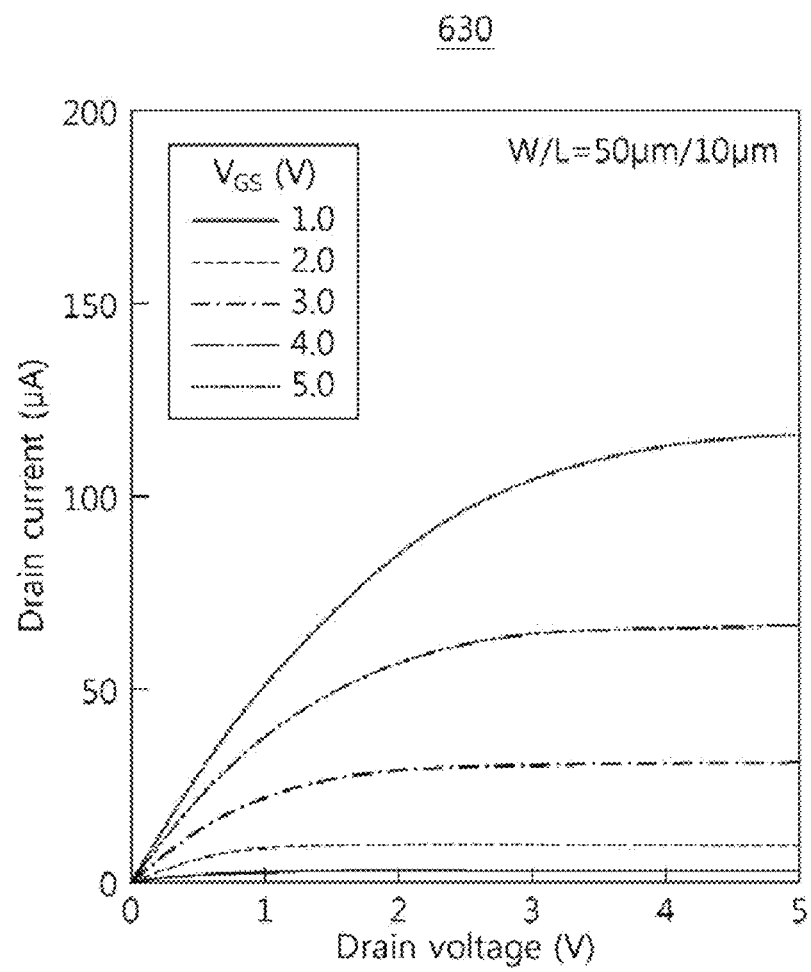

[FIG. 7A]
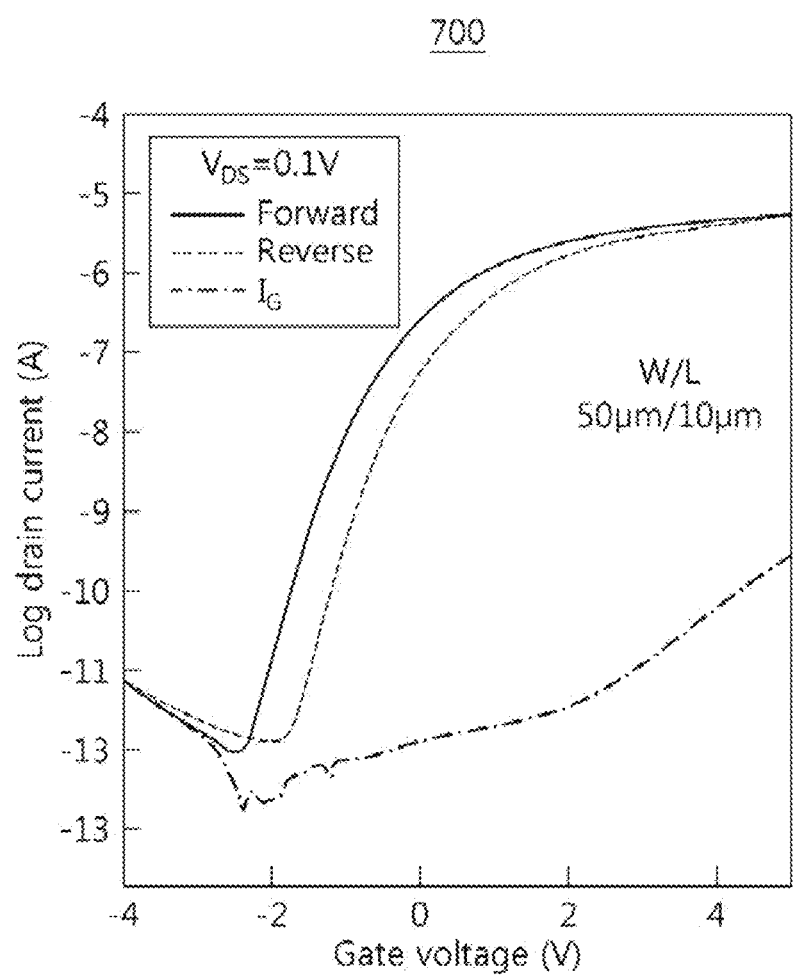

[FIG. 7B]
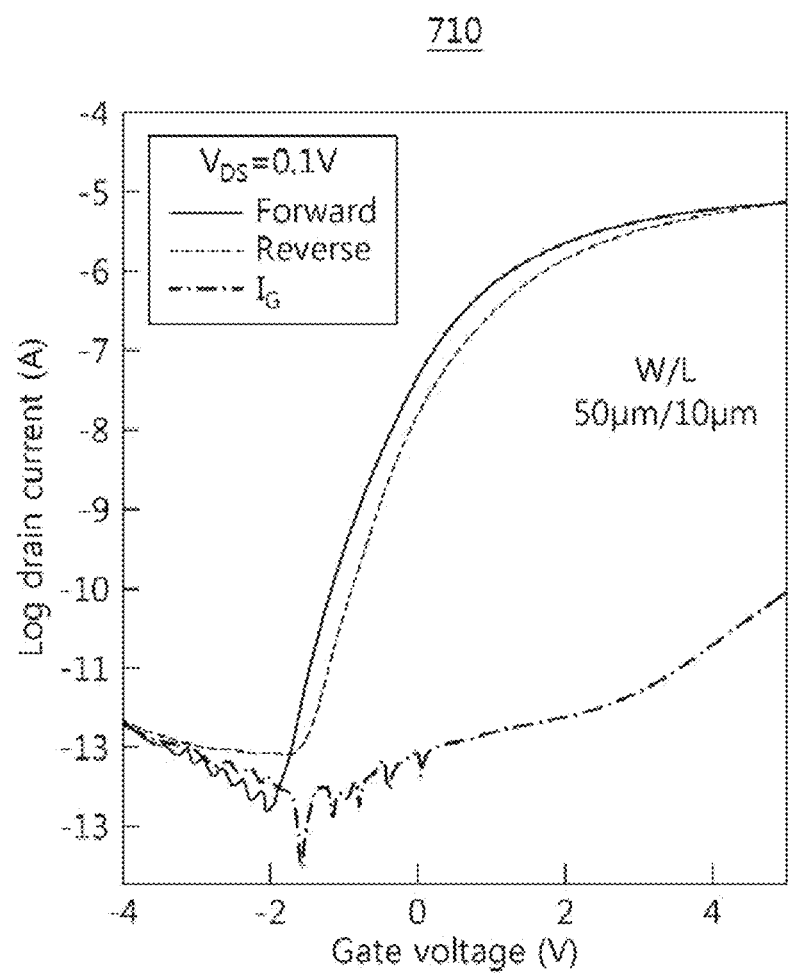

[FIG. 7C]
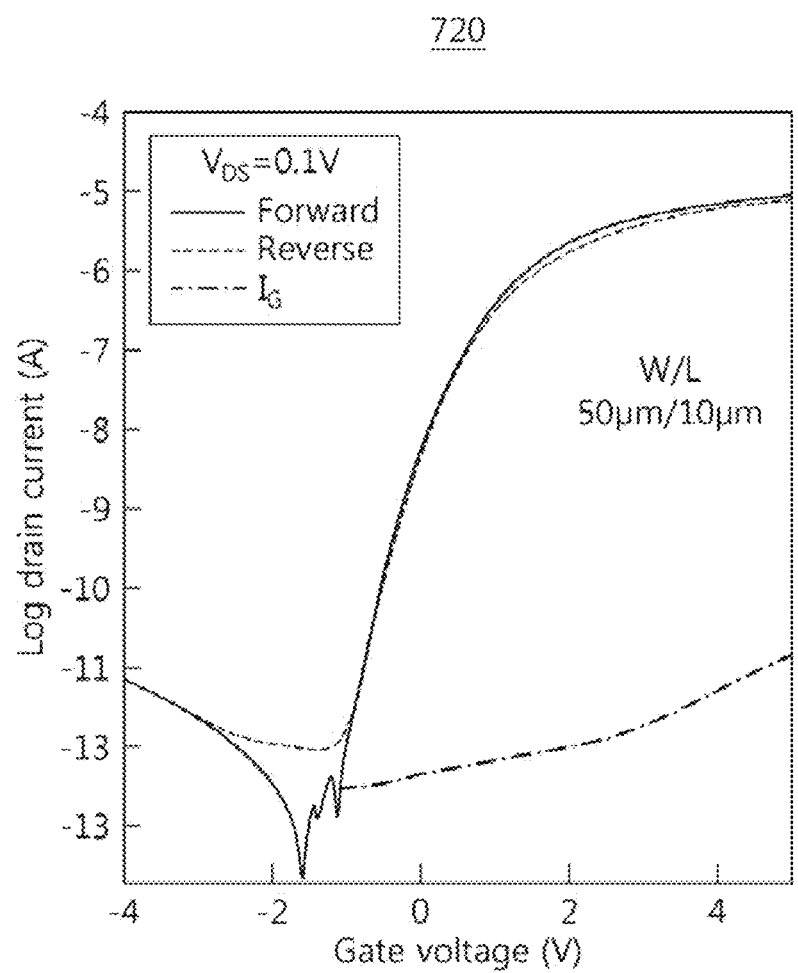

[FIG. 7D]
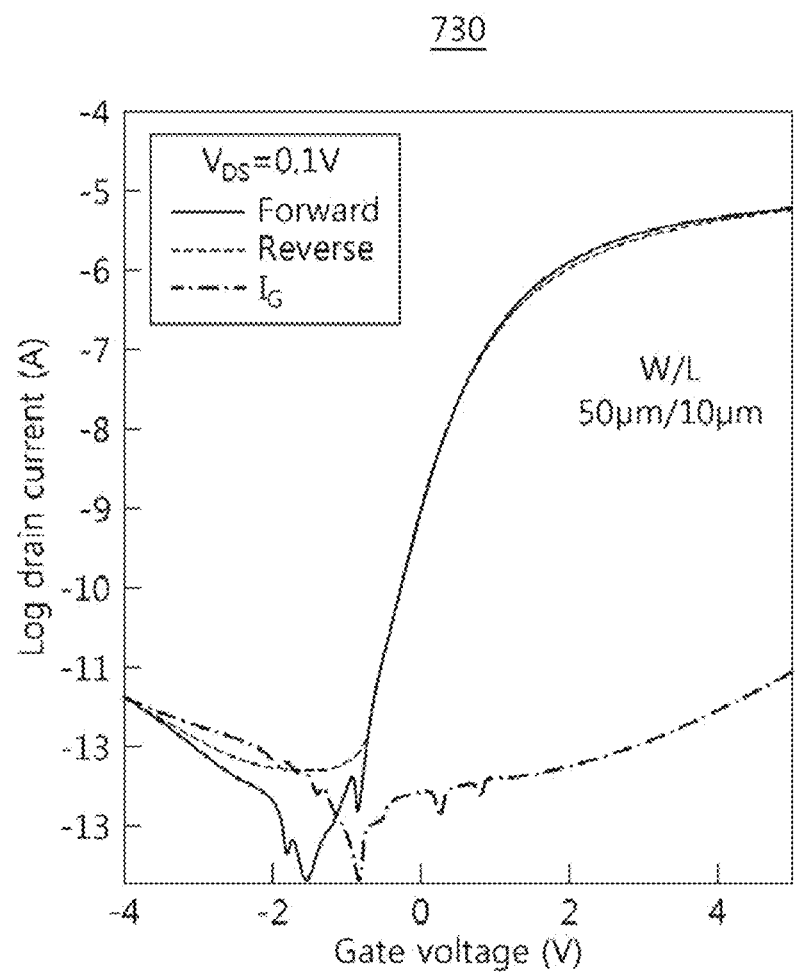

[FIG. 8A]
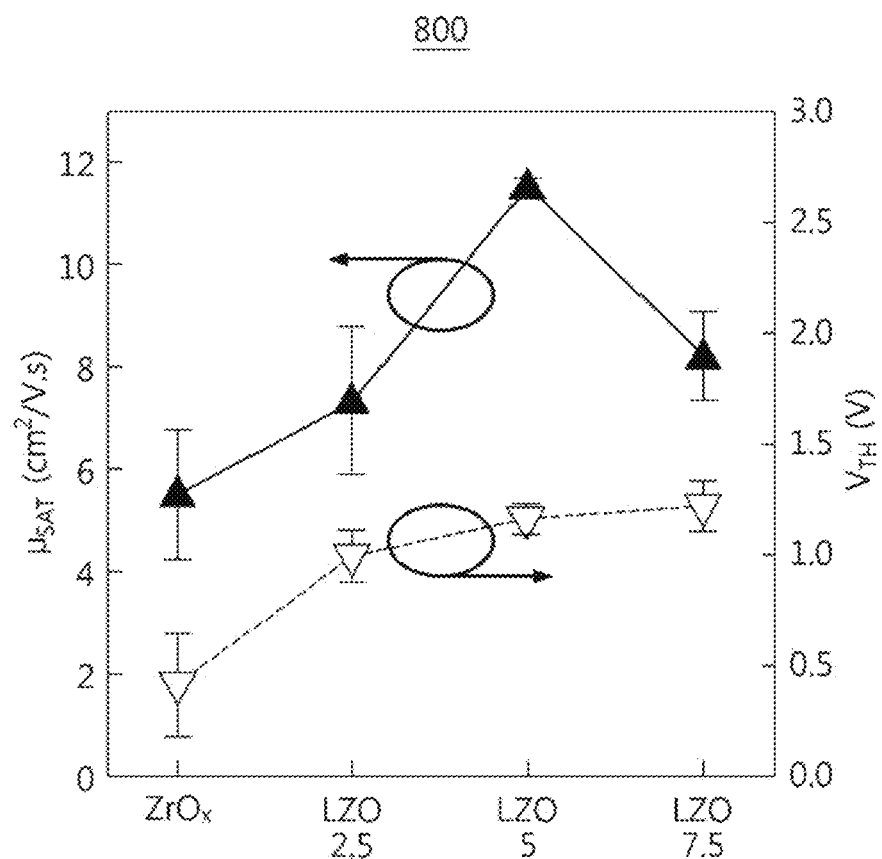

[FIG. 8B]
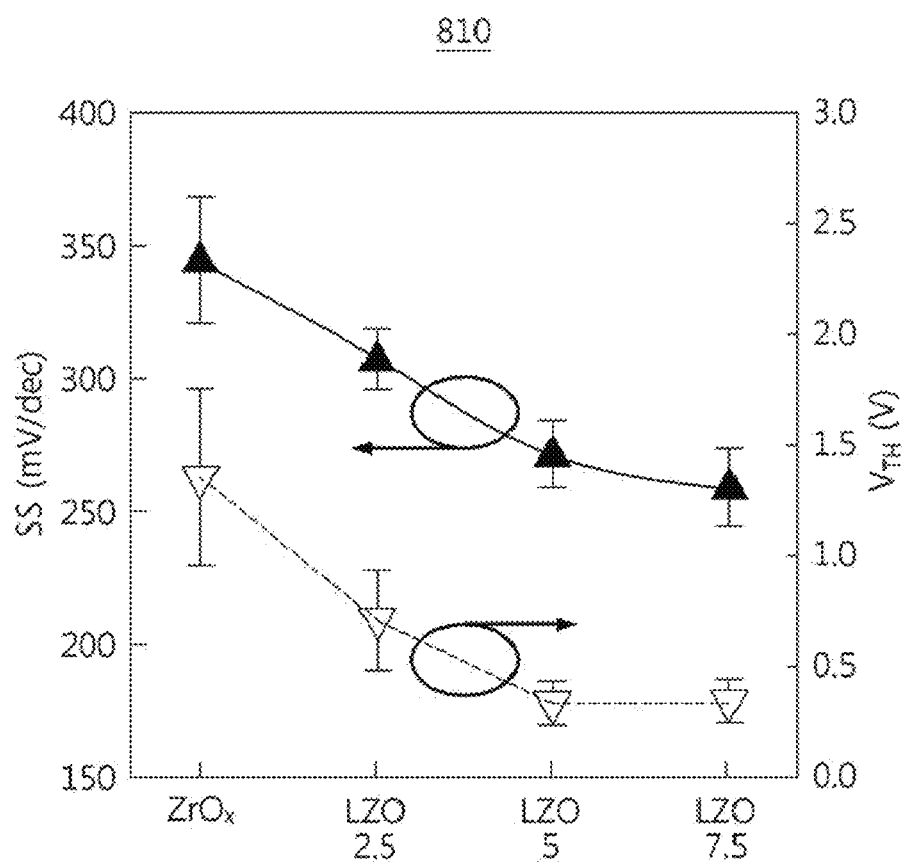

[FIG. 8C]
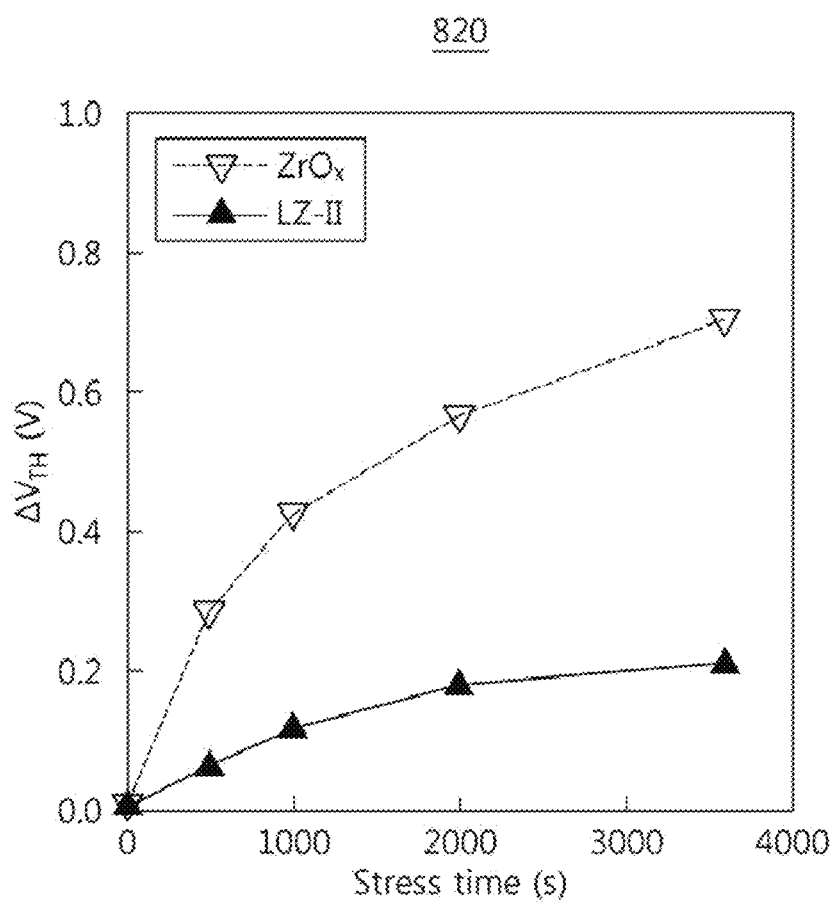

[FIG. 9A]
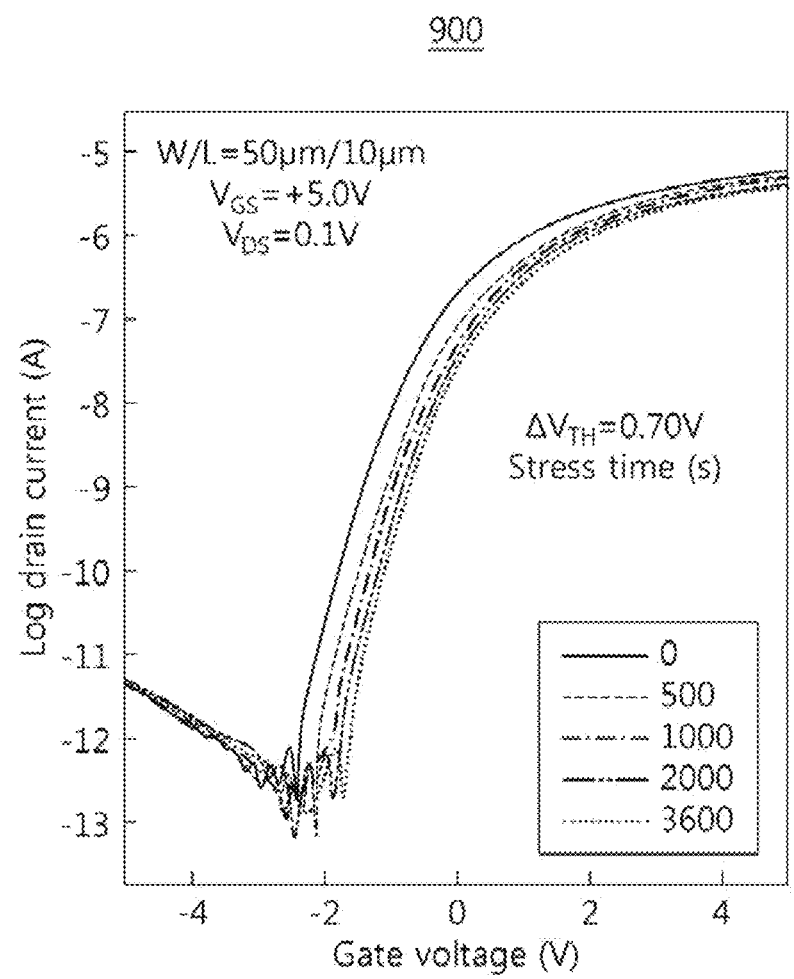

[FIG. 9B]
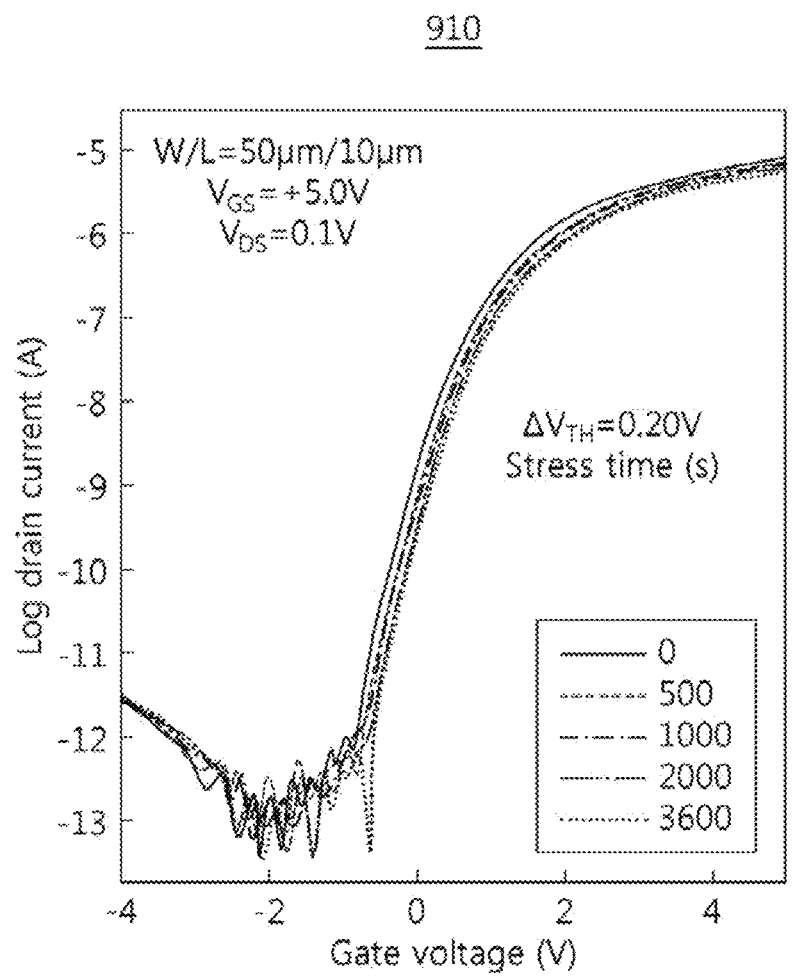

[FIG. 10A]
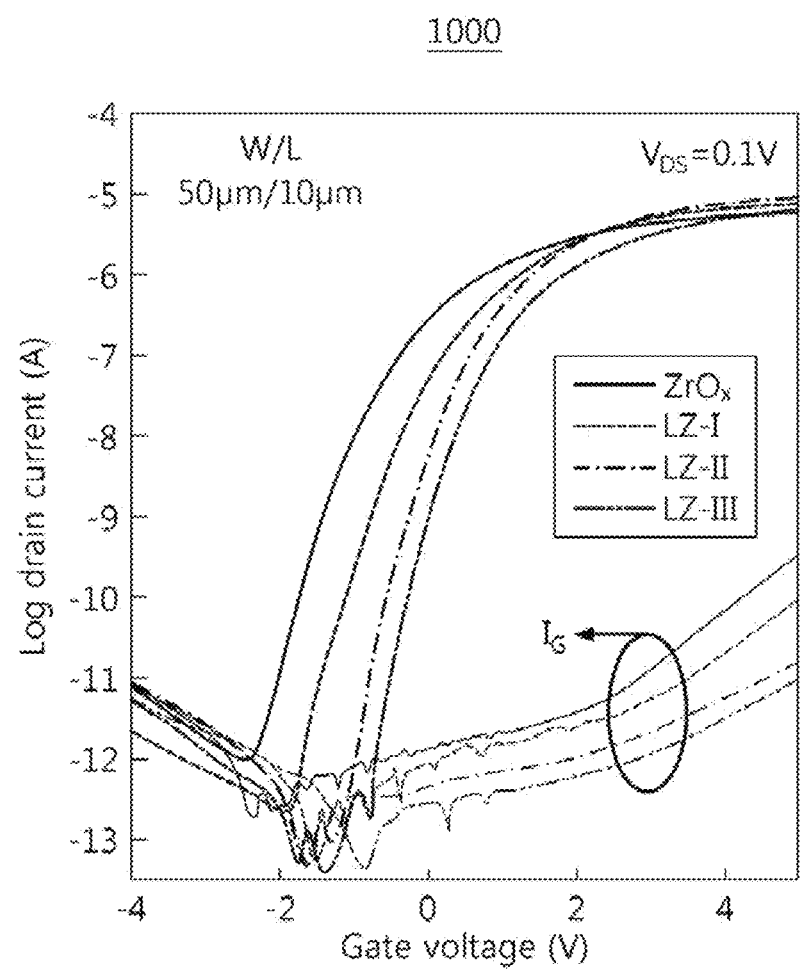

[FIG. 10B]
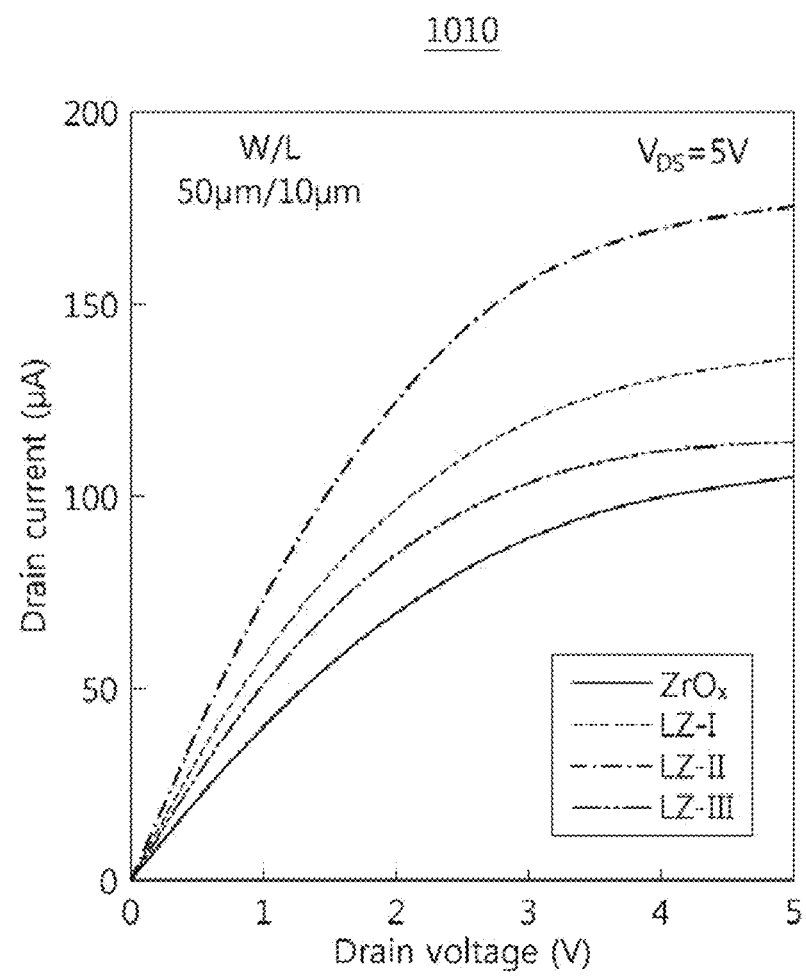

OXIDE SEMICONDUCTOR THIN-FILM TRANSISTOR AND METHOD OF FABRICATING THE SAME

CROSS-REFERENCE TO RELATED APPLICATION

This application claims priority to Korean Patent Application No. 10-2020-0136986, filed on Oct. 21, 2020 in the Korean Intellectual Property Office, the disclosure of which is incorporated herein by reference.

BACKGROUND OF THE DISCLOSURE

Field of the Disclosure

The present disclosure relates to an oxide semiconductor thin-film transistor and a method of fabricating the same, and more particularly, to an oxide semiconductor thin-film transistor capable of securing reliability by sufficiently reducing leakage current and trap density by including a gate insulating layer formed of a material having a high dielectric constant (high-k) and a method of fabricating the oxide semiconductor thin-film transistor.

Description of the Related Art

In recent years, in the display industry, technologies for improving characteristics in a short channel based on high integration of semiconductor devices have been developed.

For example, a method of thinly forming a gate insulating layer in a conventional silicon oxide semiconductor layer is used. However, when the thickness of the silicon oxide semiconductor layer is reduced, direct tunneling occurs, causing problems related to leakage current and reliability.

Accordingly, to solve the problems of the silicon oxide semiconductor layer, research on a high-dielectric-constant gate insulating layer capable of reducing leakage current between a gate electrode and a channel is being actively conducted.

Representative high-dielectric-constant materials used to form a high-dielectric-constant gate insulating layer include hafnium oxide, zirconium oxide, aluminum oxide, titanium oxide, and mixtures thereof.

However, in the case of a gate insulating layer formed of a material having a high dielectric constant, defects in electron mobility and threshold voltage occur due to trapping between the gate insulating layer, a gate electrode, and a substrate, or trapping inside the gate insulating layer.

In addition, trapping inside the gate insulating layer causes leakage current and reduces reliability, thereby reducing the reliability of an oxide semiconductor transistor.

RELATED ART DOCUMENTS

Patent Documents (Patent Document 1) Japanese Patent No. 5999525, "THIN-FILM TRANSISTOR AND METHOD OF FABRICATING THE SAME"
(Patent Document 2) Korean Patent Application Publication No. 10-2015-0054422, "METHOD OF CONTROLLING THRESHOLD VOLTAGE OF TRANSISTOR AND GATE STRUCTURE FOR CONTROLLING THRESHOLD VOLTAGE OF TRANSISTOR"
(Patent Document 3) Korean Patent Application Publication No. 10-2020-0065791, "OXIDE THIN-FILM TRANSISTOR FABRICATED BY LOW TEMPERATURE SOLUTION PROCESS AND METHOD OF FABRICATING THE SAME"
(Patent Document 4) Korean Patent Application Publication No. 10-2014-0083736, "METHOD OF FORMING GATE INSULATING LAYER AND METHOD OF FABRICATING SEMICONDUCTOR DEVICE USING GATE INSULATING LAYER"

SUMMARY OF THE DISCLOSURE

Therefore, the present disclosure has been made in view of the above problems, and it is an object of the present disclosure to solve a problem of leakage current due to direct tunneling in a thin oxide semiconductor thin-film transistor by using a mixture of a lanthanum (La) material and a zirconium (Zr) material having a high dielectric constant as a gate insulating layer.

It is another object of the present disclosure to provide an oxide semiconductor thin-film transistor capable of securing reliability by sufficiently reducing leakage current and trap density by including a high-dielectric-constant gate insulating layer formed of a mixture of a lanthanum (La) material and a zirconium (Zr) material having a high dielectric constant.

It is still another object of the present disclosure to simplify a conventional process using a vacuum system by forming a gate insulating layer using a mixture of a lanthanum (La) material and a zirconium (Zr) material by spray coating, which is a low-cost solution process.

It is yet another object of the present disclosure to improve the reliability of an oxide semiconductor thin-film transistor by improving a metal oxide network and dielectric properties by containing a small amount of a lanthanum (La) material in lanthanum zirconium oxide (LaZrOx), considering that the lanthanum (La) material has higher oxygen binding energy than a zirconium (Zr) material.

In accordance with one aspect of the present disclosure, provided is an oxide semiconductor thin-film transistor including a substrate; a gate electrode formed on the substrate; a gate insulating layer formed on the gate electrode; an oxide semiconductor layer formed on the gate insulating layer; and source and drain electrodes formed on the gate insulating layer and the oxide semiconductor layer, wherein the gate insulating layer is formed of at least one of zirconium oxide (ZrOx) and lanthanum zirconium oxide (LaZrOx) and controls electrical characteristics.

In the lanthanum zirconium oxide (LaZrOx) used to form the gate insulating layer, lanthanum (La) may be included in an amount of 2.5% to 7.5%.

At least one electrical characteristic of saturation mobility ($\mu_{SAT}$), threshold voltage ($V_{TH}$), subthreshold swing (SS), on/off current ratio, and interfacial trap density ($D_{it}$) of the oxide semiconductor thin-film transistor may be controlled according to a content of lanthanum (La) in the lanthanum zirconium oxide (LaZrOx) used to form the gate insulating layer.

The gate insulating layer may have a surface roughness of 0.19 nm to 0.35 nm according to a content of lanthanum (La) in the lanthanum zirconium oxide (LaZrOx).

At least one of the gate insulating layer and the oxide semiconductor layer may be formed by a solution process.

The oxide semiconductor layer may be formed of at least one of indium gallium zinc oxide (IGZO), indium oxide (InO), zinc oxide (ZnO), indium gallium oxide (IGO), indium aluminum oxide (IAO), indium zinc oxide (IZO), indium tin oxide (ITO), zinc tin oxide (ZTO), gallium zinc oxide (GZO), hafnium indium zinc oxide (HIZO), indium zinc tin oxide (IZTO), and aluminum zinc tin oxide (AZTO).

In accordance with another aspect of the present disclosure, provided is a display device including a substrate; the oxide semiconductor thin-film transistor of the present disclosure formed on the substrate; and a display element electrically connected to the oxide semiconductor thin-film transistor. The display element may be at least one of an organic light-emitting element and an inorganic light-emitting element.

In accordance with yet another aspect of the present disclosure, provided is a method of fabricating an oxide semiconductor thin-film transistor, the method including forming a gate electrode on a substrate; forming a gate insulating layer on the gate electrode; forming an oxide semiconductor layer on the gate insulating layer; and forming source and drain electrodes on the gate insulating layer and the oxide semiconductor layer, wherein the forming of the gate insulating layer includes forming the gate insulating layer using at least one of zirconium oxide (ZrOx) and lanthanum zirconium oxide (LaZrOx).

The forming of the gate insulating layer may include forming the gate insulating layer using the lanthanum zirconium oxide (LaZrOx), wherein lanthanum (La) is included in an amount of 2.5% to 7.5% in the lanthanum zirconium oxide (LaZrOx).

The forming of the gate insulating layer may include forming the gate insulating layer to have a thickness of 0.19 nm to 0.35 nm according to a content of lanthanum (La) in the lanthanum zirconium oxide (LaZrOx).

BRIEF DESCRIPTION OF THE DRAWINGS

The above and other objects, features and other advantages of the present disclosure will be more clearly understood from the following detailed description taken in conjunction with the accompanying drawings, in which:

FIGS. 1A to 1D are cross-sectional views for explaining a method of fabricating an oxide semiconductor thin-film transistor according to one embodiment of the present disclosure;

FIG. 2 is an optical image of an oxide semiconductor thin-film transistor according to one embodiment of the present disclosure;

FIGS. 3A to 3D are electron microscope images of a gate insulating layer according to one embodiment of the present disclosure;

FIGS. 4A to 4D show the X-ray photoelectron spectroscopy (XPS) spectra and the deconvolution spectra of an oxide semiconductor thin-film transistor according to one embodiment of the present disclosure;

FIGS. 5A to 5D are graphs for explaining the transfer characteristics of an oxide semiconductor thin-film transistor according to one embodiment of the present disclosure;

FIGS. 6A to 6D are graphs for explaining the output characteristics of an oxide semiconductor thin-film transistor according to one embodiment of the present disclosure;

FIGS. 7A to 7D are graphs for explaining the hysteresis characteristics of an oxide semiconductor thin-film transistor according to one embodiment of the present disclosure;

FIGS. 8A to 8C are graphs for explaining change in the electrical characteristics of an oxide semiconductor thin-film transistor according to one embodiment of the present disclosure;

FIGS. 9A and 9B are graphs for explaining the gate bias stress of an oxide semiconductor thin-film transistor according to one embodiment of the present disclosure and the transfer characteristics thereof according to the gate bias stress; and FIGS. 10A and 10B are graphs for explaining the electrical characteristics of an oxide semiconductor thin-film transistor according to one embodiment of the present disclosure.

DETAILED DESCRIPTION OF THE DISCLOSURE

Hereinafter, preferred embodiments of the present disclosure will be described in detail with reference to the accompanying drawings.

However, it should be understood that the present disclosure is not limited to the embodiments according to the concept of the present disclosure, but includes changes, equivalents, or alternatives falling within the spirit and scope of the present disclosure.

In the following description of the present disclosure, detailed description of known functions and configurations incorporated herein will be omitted when it may make the subject matter of the present disclosure unclear.

In addition, the terms used in the specification are defined in consideration of functions used in the present disclosure, and can be changed according to the intent or conventionally used methods of clients, operators, and users. Accordingly, definitions of the terms should be understood on the basis of the entire description of the present specification.

In description of the drawings, like reference numerals may be used for similar elements.

The singular expressions in the present specification may encompass plural expressions unless clearly specified otherwise in context.

In this specification, expressions such as "A or B" and "at least one of A and/or B" may include all possible combinations of the items listed together.

Expressions such as "first" and "second" may be used to qualify the elements irrespective of order or importance, and are used to distinguish one element from another and do not limit the elements.

It will be understood that when an element (e.g., first) is referred to as being "connected to" or "coupled to" another element (e.g., second), it may be directly connected or coupled to the other element or an intervening element (e.g., third) may be present.

As used herein, "configured to" may be used interchangeably with, for example, "suitable for", "ability to", "changed to", "made to", "capable of", or "designed to" in terms of hardware or software.

In some situations, the expression "device configured to" may mean that the device "may do ~" with other devices or components.

For example, in the sentence "processor configured to perform A, B, and C", the processor may refer to a general purpose processor (e.g., CPU or application processor) capable of performing corresponding operation by running a dedicated processor (e.g., embedded processor) for performing the corresponding operation, or one or more software programs stored in a memory device.

In addition, the expression "or" means "inclusive or" rather than "exclusive or".

That is, unless mentioned otherwise or clearly inferred from context, the expression "x uses a or b" means any one of natural inclusive permutations.

Terms, such as "unit" or "module", etc., should be understood as a unit that processes at least one function or operation and that may be embodied in a hardware manner, a software manner, or a combination of the hardware manner and the software manner.

FIGS. 1A to 1D are cross-sectional views for explaining a method of fabricating an oxide semiconductor thin-film transistor according to one embodiment of the present disclosure.

Hereinafter, the method of fabricating an oxide semiconductor thin-film transistor according to one embodiment of the present disclosure will be described in detail with reference to FIGS. 1A to 1D.

According to one embodiment of the present disclosure, the oxide semiconductor thin-film transistor may include a substrate 101, a gate electrode 102, a gate insulating layer 103, an oxide semiconductor layer 104, and source and drain electrodes 105 and 106.

For example, the gate insulating layer 103 may be formed of at least one of zirconium oxide (ZrOx) and lanthanum zirconium oxide (LaZrOx) and may control the electrical characteristics of the oxide semiconductor thin-film transistor.

Specifically, in the lanthanum zirconium oxide (LaZrOx) forming the gate insulating layer 103, lanthanum (La) may be included in an amount of 2.5% to 7.5%. The electrical characteristics of the oxide semiconductor thin-film transistor may be controlled according to the content of lanthanum (La) in the lanthanum zirconium oxide (LaZrOx).

For example, the gate insulating layer 103 may control the saturation mobility ($\mu_{SAT}$) of the oxide semiconductor thin-film transistor 100 to 5.46 cm$^2$/V$_s$ to 11.58 cm$^2$/V$_s$.

According to one embodiment of the present disclosure, the gate insulating layer 103 may control the threshold voltage ($V_{TH}$) of the oxide semiconductor thin-film transistor 100 to 0.48 V to 1.42 V.

For example, the gate insulating layer 103 may control the subthreshold swing (SS) of the oxide semiconductor thin-film transistor to 237 mV/dec to 367 mV/dec.

According to one embodiment of the present disclosure, the gate insulating layer 103 may control the headroom voltage ($V_H$) for ensuring a linear region of the oxide semiconductor thin-film transistor 100 to 0 V to 0.55 V.

For example, the gate insulating layer 103 may control the on/off current ratio of the oxide semiconductor thin-film transistor to $4.50 \times 10^5$ to $1.16 \times 10^9$.

According to one embodiment of the present disclosure, the gate insulating layer 103 may control the interfacial trap density ($D_{it}$) of the oxide semiconductor thin-film transistor 100 to $9.2 \times 10^{12}$ to $1.5 \times 10^{13}$.

Accordingly, the present disclosure may solve a problem of leakage current due to direct tunneling in a thin oxide semiconductor thin-film transistor by using a mixture of a lanthanum (La) material and a zirconium (Zr) material having a high dielectric constant as a gate insulating layer.

In addition, considering that a lanthanum (La) material has higher oxygen binding energy than a zirconium (Zr) material, even when a small amount of the lanthanum (La) material is contained in lanthanum zirconium oxide (LaZrOx), a metal oxide network and dielectric properties may be improved, thereby improving the reliability of an oxide semiconductor thin-film transistor.

Referring to FIG. 1A, according to the method of fabricating an oxide semiconductor thin-film transistor according to one embodiment of the present disclosure, the gate electrode 102 may be formed on the substrate 101.

The substrate 101 serves to support various components of the oxide semiconductor thin-film transistor and may be a flexible substrate.

The flexible substrate may be bent or folded in a specific direction. For example, the flexible substrate may be folded in a horizontal direction, a vertical direction, or an oblique direction.

The substrate 101 may be formed of any one selected from the group consisting of glass, polyimide polymers, polyester polymers, silicon polymers, acrylic polymers, polyolefin polymers, and copolymers thereof.

For example, when a flexible substrate is used as the substrate 101, the substrate 101 may be formed of any one selected from the group consisting of polyester, polyvinyl, polycarbonate, polyethylene, polyacetate, polyimide, polyethersulphone (PES), polyacrylate (PAR), polyethylene naphthalate (PEN), and polyethylene terephthalate (PET).

According to one embodiment, when a display device including a semiconductor thin-film transistor is implemented as a transparent flexible display device, the substrate 101 may be formed of a transparent material.

The substrate 101 may include at least one thin-film transistor region. A thin-film transistor (TFT) may be disposed in the thin-film transistor region, and the thin-film transistor region may be formed in a matrix form on the substrate 101.

The gate electrode 102 may be formed of a metal material. For example, the gate electrode 102 may be formed of any one of molybdenum (Mo), aluminum (Al), chromium (Cr), gold (Au), titanium (Ti), nickel (Ni), neodymium (Nd), and copper (Cu) or a combination thereof. However, the present disclosure is not limited thereto, and the gate electrode 102 may be formed using various materials. In addition, the gate electrode 102 may be formed in a single-layer or multilayer structure including the above-described material.

The gate electrode 102 may be formed using at least one of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, and zone casting.

For example, the gate electrode 102 may be formed by depositing a 40 nm-thick molybdenum (Mo) layer by sputtering and performing patterning.

Referring to FIG. 1B, according to the method of fabricating an oxide semiconductor thin-film transistor according to one embodiment of the present disclosure, the gate insulating layer 103 is formed on the gate electrode 102.

For example, the gate insulating layer 103 may insulate the gate electrode 102 and the oxide semiconductor layer 104. That is, the gate electrode 102 and the oxide semiconductor layer 104 may be insulated by the gate insulating layer 103.

According to one embodiment of the present disclosure, as shown in FIG. 1B, the gate insulating layer 103 may be formed to cover the entire surface of the substrate 101 including the gate electrode 102.

For example, the gate insulating layer 103 may be formed using a solution process such as spray coating.

Preferably, the gate insulating layer 103 may be formed by spin coating using a solution for forming the gate insulating layer. In this case, according to the spin coating, a certain amount of the solution for forming the gate insulating layer 103 is dropped onto the substrate 101, and the substrate 101 is rotated at high speed to apply centrifugal force to the solution for forming the gate insulating layer 103. Compared to deposition, the use of spin coating may reduce production cost, and process cost and process time may be reduced through simplification of process technology.

Accordingly, the present disclosure may simplify a conventional process using a vacuum system by forming a gate insulating layer using a mixture of a lanthanum (La) material and a zirconium (Zr) material by spray coating, which is a low-cost solution process.

According to one embodiment of the present disclosure, the gate insulating layer 103 may be formed of at least one of zirconium oxide (ZrOx) and lanthanum zirconium oxide (LaZrOx), and may control the electrical characteristics of the oxide semiconductor thin-film transistor 100.

For example, in the lanthanum zirconium oxide (LaZrOx) forming the gate insulating layer 103, lanthanum (La) may be included in an amount of 2.5% to 7.5%.

For example, the gate insulating layer 103 may be formed by performing spin coating using a precursor solution containing any one of zirconium oxide (ZrOx) and lanthanum zirconium oxide (LaZrOx) at 3,500 rpm for 30 seconds, performing curing at 250° C. for about 5 minutes on a hot plate, and then performing ultraviolet curing at 100° C. for 5 minutes in the atmosphere.

According to the present disclosure, considering that a lanthanum (La) material has higher oxygen binding energy than a zirconium (Zr) material, even when a small amount of the lanthanum (La) material is contained in lanthanum zirconium oxide (LaZrOx), a metal oxide network and dielectric properties may be improved, thereby improving the reliability of an oxide semiconductor thin-film transistor.

Referring to FIG. 1C, according to the method of fabricating an oxide semiconductor thin-film transistor according to one embodiment of the present disclosure, the oxide semiconductor layer 104 is formed on the gate insulating layer 103.

For example, according to the method of fabricating the oxide semiconductor thin-film transistor 100, to form the oxide semiconductor layer 104, a film for forming the oxide semiconductor layer 104 is formed on the gate insulating layer 103 to cover the entire surface of the gate insulating layer 103, a photoresist pattern is formed on the oxide semiconductor film, and patterning of the oxide semiconductor film is performed using the photoresist pattern as a mask to correspond to the gate electrode 102 in a thin-film transistor region.

That is, according to the method of fabricating the oxide semiconductor thin-film transistor, the oxide semiconductor layer may be formed on the gate insulating layer to correspond to the gate electrode.

For example, the oxide semiconductor layer 104 may be formed using a solution process such as spray coating.

Preferably, the oxide semiconductor layer 104 may be formed by spin coating using a solution for forming the oxide semiconductor layer 104. In this case, according to the spin coating, a certain amount of the solution for forming the oxide semiconductor layer 104 is dropped onto the gate insulating layer 103, and the substrate 101 is rotated at high speed to apply centrifugal force to the solution for forming the oxide semiconductor layer 104. Compared to deposition, the use of spin coating may reduce production cost, and process cost and process time may be reduced through simplification of process technology.

According to one embodiment of the present disclosure, the oxide semiconductor layer 104 may be formed of at least one of indium gallium zinc oxide (IGZO), indium oxide (InO), zinc oxide (ZnO), indium gallium oxide (IGO), indium aluminum oxide (IAO), indium zinc oxide (IZO), indium tin oxide (ITO), zinc tin oxide (ZTO), gallium zinc oxide (GZO), hafnium indium zinc oxide (HIZO), indium zinc tin oxide (IZTO), and aluminum zinc tin oxide (AZTO).

For example, the oxide semiconductor layer 104 may be formed by depositing a zinc oxide (ZnO) precursor solution at a substrate temperature of 350° C. in the atmosphere through a spray pyrolysis process and then repeating the spraying process several cycles successively to form a 25 nm-thick ZnO layer.

The present disclosure may simplify a conventional process using a vacuum system by forming a gate insulating layer using a mixture of a lanthanum (La) material and a zirconium (Zr) material by spray coating, which is a low-cost solution process.

Referring to FIG. 1D, according to the method of fabricating an oxide semiconductor thin-film transistor according to one embodiment of the present disclosure, a source electrode 105 and a drain electrode 106 may be formed on the oxide semiconductor layer 104 to be spaced apart from each other.

According to one embodiment of the present disclosure, according to the method of fabricating the oxide semiconductor thin-film transistor, the source electrode 105 and the drain electrode 106 may be formed to be spaced apart from each other on the oxide semiconductor layer 104 formed on the gate insulating layer 103. In this case, the source electrode 105 and the drain electrode 106 may be formed to be electrically connected to the oxide semiconductor layer 104, respectively.

Accordingly, according to the present disclosure, by reducing the area of source and drain electrodes, parasitic capacitance generated between a gate electrode and the source electrode or the drain electrode may be reduced, thereby providing an oxide semiconductor thin-film transistor used as a pixel element of a display device with high-performance electrical characteristics and a method of fabricating the oxide semiconductor thin-film transistor.

For example, the source and drain electrodes 105 and 106 may be formed using at least one of vacuum deposition, chemical vapor deposition, physical vapor deposition, atomic layer deposition, metal organic chemical vapor deposition, plasma-enhanced chemical vapor deposition, molecular beam epitaxy, hydride vapor phase epitaxy, sputtering, spin coating, dip coating, and zone casting.

According to one embodiment of the present disclosure, the source and drain electrodes 105 and 106 may be formed by performing patterning on each of the gate insulating layer 103 and the oxide semiconductor layer 104 so that active islands and via holes are formed on the gate insulating layer 103 and the oxide semiconductor layer 104, and performing patterning of a 40 nm-thick molybdenum (Mo) layer through sputtering.

FIG. 2 is an optical image of an oxide semiconductor thin-film transistor according to one embodiment of the present disclosure.

Referring to FIG. 2, in an oxide semiconductor thin-film transistor 200, a gate insulating layer 203 is disposed between a gate electrode 201 and an oxide semiconductor layer 202, and the gate insulating layer insulates the gate electrode 201 and the oxide semiconductor layer 202.

In addition, source and drain electrodes 204 are disposed on the left and the right with respect to the gate electrode 201, the oxide semiconductor layer 202, and the gate insulating layer 203.

FIGS. 3A to 3D are electron microscope images of a gate insulating layer according to one embodiment of the present disclosure.

FIGS. 3A to 3D illustrate change in the surface roughness of the gate insulating layer of the oxide semiconductor thin-film transistor according to one embodiment of the present disclosure depending on the content of lanthanum (La) in a material forming the gate insulating layer.

FIG. 3A illustrates a gate insulating layer 300 formed of zirconium oxide (ZrOx), FIG. 3B illustrates a gate insulating layer 310 formed of lanthanum zirconium oxide (LaZrOx) including 2.5% of lanthanum (La), FIG. 3C illustrates a gate insulating layer 320 formed of lanthanum zirconium oxide (LaZrOx) including 5% of lanthanum (La), and FIG. 3D illustrates a gate insulating layer 330 formed of lanthanum zirconium oxide (LaZrOx) including 7.5% of lanthanum (La).

According to one embodiment of the present disclosure, the gate insulating layer 300 may have a surface roughness of 0.35 nm, the gate insulating layer 310 may have a surface roughness of 0.23 nm, the gate insulating layer 320 may have a surface roughness of 0.20 nm, and the gate insulating layer 330 may have a surface roughness of 0.19 nm.

That is, the gate insulating layer may have a surface roughness of 0.19 nm to 0.35 nm according to the content of lanthanum (La) in the lanthanum zirconium oxide (LaZrOx).

Although the ionic radius of lanthanum is larger than that of zirconium, surface roughness decreases as the content of lanthanum increases, and thus the uniformity of the gate insulating layer may be improved by adjusting the content of lanthanum.

FIGS. 4A to 4D show the X-ray photoelectron spectroscopy (XPS) spectra and the deconvolution spectra of an oxide semiconductor thin-film transistor according to one embodiment of the present disclosure.

In graph 400 of FIG. 4A, the X-ray photoelectron spectroscopy spectra of Zr 3d is compared with the X-ray photoelectron spectroscopy spectra of a zirconium oxide (ZrOx)-based gate insulating layer and a lanthanum zirconium oxide (LaZrOx)-based gate insulating layer.

Graph 400 of FIG. 4A shows that the XPS spectrum of the Zr 3d is separated by 2.4 eV and an ionic bond between $Zr^{4+}$ and $O^{2-}$ is formed in ZrOx and LZ-.

In graph 410 of FIG. 4B, the X-ray photoelectron spectroscopy spectra of La 3d is compared with the X-ray photoelectron spectroscopy spectra of lanthanum zirconium oxide (LaZrOx).

As shown in graph 410 of FIG. 4B, the magnitude of multiple division of La $3d_{5/2}$ in the lanthanum zirconium oxide (LaZrOx)-based gate insulating layer is up to 4.3 eV.

Graph 420 of FIG. 4C and graph 430 of FIG. 4D show the O1s peak of a zirconium oxide (ZrOx)-based gate insulating layer and the O1s peak of a lanthanum zirconium oxide (LaZrOx)-based gate insulating layer, respectively.

The O1s peaks of the zirconium oxide (ZrOx)-based gate insulating layer are separated into metal oxygen (M-O), $V_O$, and $OH^-$ impurity peaks centered on 529.0 eV, 530.5 eV, and 531.6 eV, respectively.

Similarly, the unresolved O1s peaks of the lanthanum zirconium oxide (LaZrOx)-based gate insulating layer are centered on 529.7 eV, 531.2 eV, and 532.1 eV, respectively. In addition, the atomic percentages of M-O, $V_O$, and $OH^-$ may be calculated based on relative area ratio.

When 5% of lanthanum (La) is added to zirconium oxide (ZrOx), M-O binding concentration increases from 63.33% to 74.71%, $V_O$ binding concentration decreases from 22.92% to 15.52%, and $OH^-$ binding concentration decreases from 13.75% to 9.77%.

In the bonding state of molybdenum (MO) increased in the lanthanum zirconium oxide (LaZrOx)-based gate insulating layer, the oxygen bond dissociation energy of lanthanum (La) is greater than the oxygen bond dissociation energy of zirconium (Zr). Thus, M-O binding concentration increases, and $V_O$ and $OH^-$ binding concentrations decrease.

Accordingly, considering that a lanthanum (La) material has higher oxygen binding energy than a zirconium (Zr) material, even when a small amount of the lanthanum (La) material is contained in lanthanum zirconium oxide (LaZrOx), a metal oxide network and dielectric properties may be improved, thereby improving the reliability of an oxide semiconductor thin-film transistor.

FIGS. 5A to 5D are graphs for explaining the transfer characteristics of an oxide semiconductor thin-film transistor according to one embodiment of the present disclosure.

Graph 500 of FIG. 5A shows the transfer characteristics of zirconium oxide (ZrOx), graph 510 of FIG. 5B shows the transfer characteristics of lanthanum zirconium oxide (LaZrOx) including 2.5% of lanthanum (La), graph 520 of FIG. 5C shows the transfer characteristics of lanthanum zirconium oxide (LaZrOx) including 5% of lanthanum (La), and graph 530 of FIG. 5D shows the transfer characteristics of lanthanum zirconium oxide (LaZrOx) including 7.5% of lanthanum (La).

Referring to FIGS. 5A to 5D, graphs 500, 510, 520, and 530 show transfer characteristic curves according to gate voltage and drain current.

For example, the transfer characteristic curves represent the relationship between inputs and outputs in a transistor, and may be referred to as transfer curves.

FIGS. 6A to 6D are graphs for explaining the output characteristics of an oxide semiconductor thin-film transistor according to one embodiment of the present disclosure.

Graph 600 of FIG. 6A shows the transfer characteristics of zirconium oxide (ZrOx), graph 610 of FIG. 6B shows the transfer characteristics of lanthanum zirconium oxide (LaZrOx) including 2.5% of lanthanum (La), graph 620 of FIG. 6C shows the transfer characteristics of lanthanum zirconium oxide (LaZrOx) including 5% of lanthanum (La), and graph 630 of FIG. 6D shows the transfer characteristics of lanthanum zirconium oxide (LaZrOx) including 7.5% of lanthanum (La).

Referring to FIGS. 6A to 6D, graphs 600, 610, 620, and 630 show output characteristic curves according to gate voltage and drain current.

For example, the output characteristic curves represent the relationship between inputs and outputs in a transistor, and may be referred to as output curves.

FIGS. 7A to 7D are graphs for explaining the hysteresis characteristics of an oxide semiconductor thin-film transistor according to one embodiment of the present disclosure.

Graph 700 of FIG. 7A shows the transfer characteristics of zirconium oxide (ZrOx), graph 710 of FIG. 7B shows the transfer characteristics of lanthanum zirconium oxide (LaZrOx) including 2.5% of lanthanum (La), graph 720 of FIG. 7C shows the transfer characteristics of lanthanum zirconium oxide (LaZrOx) including 5% of lanthanum (La), and graph 730 of FIG. 7D shows the transfer characteristics of lanthanum zirconium oxide (LaZrOx) including 7.5% of lanthanum (La).

Referring to FIGS. 7A to 7D, graphs 700, 710, 720, and 730 show hysteresis characteristic curves according to gate voltage and drain current.

For example, the hysteresis characteristic curves represent the relationship between inputs and outputs in a transistor, and may be referred to as hysteresis curves.

FIGS. 8A to 8C are graphs for explaining change in the electrical characteristics of an oxide semiconductor thin-film transistor according to one embodiment of the present disclosure.

FIG. 8A shows saturation mobility and the mean deviation of change in threshold voltage according to change in a material forming the gate insulating layer of the oxide semiconductor thin-film transistor according to one embodiment of the present disclosure.

Referring to graph 800 of FIG. 8A, in the oxide semiconductor thin-film transistor according to one embodiment of the present disclosure, as the content of lanthanum (La) in lanthanum zirconium oxide (LaZrOx) forming the gate insulating layer increases, saturation mobility and the mean deviation of change in threshold voltage may increase.

FIG. 8B shows change in the subthreshold swing (SS) of the oxide semiconductor thin-film transistor according to one embodiment of the present disclosure according to change in a material forming the gate insulating layer.

Referring to graph 810 of FIG. 8B, in the oxide semiconductor thin-film transistor according to one embodiment of the present disclosure, as the content of lanthanum (La) in the lanthanum zirconium oxide (LaZrOx) forming the gate insulating layer increases, the subthreshold swing (SS) of the oxide semiconductor thin-film transistor may decrease.

FIG. 8C shows threshold voltage change versus stress time in the oxide semiconductor thin-film transistor according to one embodiment of the present disclosure.

Graph 820 of FIG. 8C shows change in threshold voltage according to stress time for a case of forming the gate insulating layer using zirconium oxide (ZrOx) and a case of forming the gate insulating layer using lanthanum zirconium oxide (LaZrOx) in the oxide semiconductor thin-film transistor according to one embodiment of the present disclosure.

In the oxide semiconductor thin-film transistor according to one embodiment of the present disclosure, compared to the case of forming the gate insulating layer using zirconium oxide (ZrOx), in the case of forming the gate insulating layer using lanthanum zirconium oxide (LaZrOx), the degree of change in threshold voltage according to stress time may be small.

That is, according to one embodiment of the present disclosure, when stress time is 3,000 (s) to 4,000 (s), an oxide semiconductor thin-film transistor including a zirconium oxide (ZrOx)-based gate insulating layer has a threshold voltage of about 0.7 V, and an oxide semiconductor thin-film transistor including a lanthanum zirconium oxide (LaZrOx)-based gate insulating layer has a threshold voltage of about 0.2 V.

For example, the lanthanum zirconium oxide (LaZrOx)-based gate insulating layer may be formed using lanthanum zirconium oxide (LaZrOx) including 5% of lanthanum (La).

Accordingly, a very stable and uniform oxide semiconductor thin-film transistor may be provided due to smooth interface and low defect density between the lanthanum zirconium oxide (LaZrOx)-based gate insulating layer and the oxide semiconductor layer.

FIGS. 9A and 9B are graphs for explaining the gate bias stress of an oxide semiconductor thin-film transistor according to one embodiment of the present disclosure and the transfer characteristics thereof according to the gate bias stress.

FIG. 9A shows the transfer characteristics of an oxide semiconductor thin-film transistor including a gate insulating layer formed using zirconium oxide (ZrOx) according to one embodiment of the present disclosure, and FIG. 9B shows the transfer characteristics of an oxide semiconductor thin-film transistor including a gate insulating layer formed using lanthanum zirconium oxide (LaZrOx).

In both graph 900 of FIG. 9A and graph 910 of FIG. 9B, gate voltage ($V_{GS}$) is 5 V, and drain voltage (VDS) is 0.1 V.

Comparing graph 900 of FIG. 9A with graph 910 of FIG. 9B, the transfer characteristics of an oxide semiconductor thin-film transistor including a gate insulating layer formed using zirconium oxide (ZrOx) and an oxide semiconductor thin-film transistor including a gate insulating layer formed using lanthanum zirconium oxide (LaZrOx) evolve for 3,600 seconds during positive bias stress (PBS).

Comparing graph 900 of FIG. 9A with graph 910 of FIG. 9B, the oxide semiconductor thin-film transistor including a gate insulating layer formed using zirconium oxide (ZrOx) and the oxide semiconductor thin-film transistor including a gate insulating layer formed using lanthanum zirconium oxide (LaZrOx) have threshold voltages of 0.70 V and 0.20 V, respectively.

As shown in the graphs of FIGS. 5A to 9B, the electrical characteristics of the oxide semiconductor thin-film transistor according to one embodiment of the present disclosure may be controlled according to materials for forming a gate insulating layer shown in Table 1 below.

TABLE 1

| Materials for forming gate insulating layer | $\mu_{SAT}$ [cm²/V$_s$] | $V_{TH}$ [V] | SS [mV/dec] | $V_H$ [V] | $I_{ON}/I_{OFF}$ | $D_{it}$ [cm$^{-2}$] |
|---|---|---|---|---|---|---|
| ZrO$_x$ | 5.46 | 0.48 | 367 | 0.55 | 4.50 × 10⁵ | 1.5 × 10¹³ |
| LZO-2.5 | 8.41 | 1.16 | 293 | 0.30 | 2.21 × 10⁷ | 1.1 × 10¹³ |
| LZO-5 | 11.58 | 1.25 | 249 | ~0 | 2.67 × 10⁸ | 9.6 × 10¹² |
| LZO-7.5 | 7.55 | 1.42 | 237 | ~0 | 1.16 × 10⁸ | 9.2 × 10¹² |

Accordingly, the gate insulating layer according to one embodiment of the present disclosure may control the saturation mobility ($\mu_{SAT}$) of an oxide semiconductor thin-film transistor to 5.46 cm²/V$_s$ to 11.58 cm²/V$_s$.

In addition, the gate insulating layer may control the threshold voltage ($V_{TH}$) of the oxide semiconductor thin-film transistor to 0.48 V to 1.42 V.

In addition, the gate insulating layer may control the subthreshold swing (SS) of the oxide semiconductor thin-film transistor to 237 mV/dec to 367 mV/dec.

In addition, the gate insulating layer may control the headroom voltage ($V_H$) for ensuring a linear region of the oxide semiconductor thin-film transistor to 0 V to 0.55 V.

In addition, the gate insulating layer may control the on/off current ratio ($I_{ON}/I_{OFF}$) of the oxide semiconductor thin-film transistor to 4.50×10⁵ to 1.16×10⁸.

In addition, the gate insulating layer may control the interfacial trap density ($D_{it}$) of the oxide semiconductor thin-film transistor to 9.2×10¹² to 1.5×10¹³.

Accordingly, the present disclosure may provide an oxide semiconductor thin-film transistor capable of securing reliability by sufficiently reducing leakage current and trap density by including a high-dielectric-constant gate insulating layer formed of a mixture of a lanthanum (La) material and a zirconium (Zr) material having a high dielectric constant.

FIGS. 10A and 10B are graphs for explaining the electrical characteristics of an oxide semiconductor thin-film transistor according to one embodiment of the present disclosure.

FIGS. 10A and 10B show electrical characteristics according to change in a material for forming a gate insulating layer at room temperature.

Graph 1000 of FIG. 10A and graph 1010 of FIG. 10B show the transfer and output curves of an oxide semiconductor thin-film transistor including a gate insulating layer formed using zirconium oxide (ZrOx) and an oxide semiconductor thin-film transistor including a gate insulating layer formed using lanthanum zirconium oxide (LaZrOx).

Referring to graph 1000 of FIG. 10A and graph 1010 of FIG. 10B, compared to the oxide semiconductor thin-film transistor including a gate insulating layer formed using zirconium oxide (ZrOx), the electrical characteristics of the oxide semiconductor thin-film transistor including a gate insulating layer formed using lanthanum zirconium oxide (LaZrOx) are further improved.

In addition, compared to the oxide semiconductor thin-film transistor including a gate insulating layer formed using zirconium oxide (ZrOx), the oxide semiconductor thin-film transistor including a gate insulating layer formed using lanthanum zirconium oxide (LaZrOx) exhibits improved electrical characteristics in terms of gate leakage current.

The oxide semiconductor thin-film transistor and the method of fabricating the oxide semiconductor thin-film transistor have been described. In addition, a display device using the oxide semiconductor thin-film transistor and a method of fabricating the display device may also fall within the scope of the present disclosure.

Specifically, the oxide semiconductor thin-film transistor according to an embodiment of the present disclosure may be used as a pixel element included in a flexible display device such as a liquid crystal display (LCD) and an active matrix organic light-emitting diode (AMOLED).

For example, the display element may be at least one light-emitting element of an organic light-emitting element and an inorganic light-emitting element (micro LED).

More specifically, after the oxide semiconductor thin-film transistor is fabricated using the above-described method, a pixel electrode may be formed to be electrically connected to any one of the source and drain electrodes to produce a display device.

For example, as shown in FIGS. 1A to 1D, according to a method of fabricating a display device according to one embodiment of the present disclosure, a passivation layer for covering source and drain electrodes may be formed, and then a pixel electrode connected to a drain electrode through the through hole of the passivation layer may be formed.

In addition, according to the method of fabricating a display device according to one embodiment of the present disclosure, an intermediate layer (not shown) including a light-emitting layer may be formed on the pixel electrode, and a counter electrode may be formed thereon to produce an organic light-emitting display device.

Accordingly, according to the present disclosure, the oxide semiconductor thin-film transistor with improved electrical characteristics may be used as a pixel element included in a flexible display device such as a liquid crystal display (LCD) and an active matrix organic light-emitting diode (AMOLED).

The present disclosure can solve a problem of leakage current due to direct tunneling in a thin oxide semiconductor thin-film transistor by using a mixture of a lanthanum (La) material and a zirconium (Zr) material having a high dielectric constant as a gate insulating layer.

The present disclosure can provide an oxide semiconductor thin-film transistor capable of securing reliability by sufficiently reducing leakage current and trap density by including a high-dielectric-constant gate insulating layer formed of a mixture of a lanthanum (La) material and a zirconium (Zr) material having a high dielectric constant.

The present disclosure can simplify a conventional process using a vacuum system by forming a gate insulating layer using a mixture of a lanthanum (La) material and a zirconium (Zr) material by spray coating, which is a low-cost solution process.

The present disclosure can improve the reliability of an oxide semiconductor thin-film transistor by improving a metal oxide network and dielectric properties by containing a small amount of a lanthanum (La) material in lanthanum zirconium oxide (LaZrOx), considering that the lanthanum (La) material has higher oxygen binding energy than a zirconium (Zr) material.

The methods according to claims of the present disclosure or the embodiments described in the specification may be implemented in hardware, software, or a combination of hardware and software.

The software may be stored in a computer-readable storage medium. When executed by at least one program (software module) or at least one processor, the computer-readable storage medium stores at least one program that includes instructions that cause the electronic device to perform the method of the present disclosure.

Such software may be stored on optical or magnetic readable media, such as compact disc-ROM (CD-ROM), digital versatile discs (DVDs), magnetic disks, or magnetic tapes, in the form of a volatile storage device or a non-volatile storage device such as read only memory (ROM), or in the form of a memory such as random access memory (RAM), memory chips, or integrated circuits.

The storage device and medium are machine-readable storage means suitable for storing programs including instructions for implementing embodiments when executed.

In the above-described specific embodiments, elements included in the invention are expressed in singular or plural in accordance with the specific embodiments.

However, the singular or plural representations are appropriately selected for the situation presented for convenience of explanation, and the above-described embodiments are not limited to the singular or plural constituent elements. In addition, elements may be composed of the singular number, even when the elements are expressed in the plural number, and an element may be composed of the plural number, even when the element is expressed in the singular number.

In addition, the present disclosure has been described with reference to exemplary embodiments, but it should be understood that various modifications may be made without departing from the scope of the present disclosure.

Therefore, the scope of the present disclosure should not be limited by the embodiments, but should be determined by the following claims and equivalents to the following claims.

| Description of Symbols | |
| --- | --- |
| 100: OXIDE SEMICONDUCTOR THIN-FILM TRANSISTOR | |
| 101: SUBSTRATE | 102: GATE ELECTRODE |
| 103: GATE INSULATING LAYER | 104: OXIDE SEMICONDUCTOR LAYER |
| 105: SOURCE ELECTRODE | 106: DRAIN ELECTRODE |

What is claimed is:

1. An oxide semiconductor thin-film transistor, comprising:
    a substrate;
    a gate electrode formed on the substrate;
    a gate insulating layer formed on the gate electrode;
    an oxide semiconductor layer formed on the gate insulating layer; and
    source and drain electrodes formed on the gate insulating layer and the oxide semiconductor layer,
    wherein the gate insulating layer is formed of at least one of zirconium oxide (ZrOx) and lanthanum zirconium oxide (LaZrOx) and controls electrical characteristics, and
    wherein, in the lanthanum zirconium oxide (LaZrOx) used to form the gate insulating layer, lanthanum (La) is comprised in an amount of 2.5 at % to 7.5 at %.

2. The oxide semiconductor thin-film transistor according to claim 1, wherein at least one electrical characteristic of saturation mobility ($\mu_{SAT}$), threshold voltage ($V_{TH}$), sub-threshold swing (SS), on/off current ratio, and interfacial trap density ($D_{it}$) of the oxide semiconductor thin-film transistor is controlled according to a content of lanthanum (La) in the lanthanum zirconium oxide (LaZrOx) used to form the gate insulating layer.

3. The oxide semiconductor thin-film transistor according to claim 1, wherein the gate insulating layer has a surface roughness of 0.19 nm to 0.35 nm according to a content of lanthanum (La) in the lanthanum zirconium oxide (LaZrOx).

4. The oxide semiconductor thin-film transistor according to claim 1, wherein at least one of the gate insulating layer and the oxide semiconductor layer is formed by a solution process.

5. The oxide semiconductor thin-film transistor according to claim 1, wherein the oxide semiconductor layer is formed of at least one of indium gallium zinc oxide (IGZO), indium oxide (InO), zinc oxide (ZnO), indium gallium oxide (IGO), indium aluminum oxide (IAO), indium zinc oxide (IZO), indium tin oxide (ITO), zinc tin oxide (ZTO), gallium zinc oxide (GZO), hafnium indium zinc oxide (HIZO), indium zinc tin oxide (IZTO), and aluminum zinc tin oxide (AZTO).

6. A display device, comprising:
    a substrate;
    the oxide semiconductor thin-film transistor according to claim 1 formed on the substrate; and
    a display element electrically connected to the oxide semiconductor thin-film transistor.

7. The display device according to claim 6, wherein the display element is at least one of an organic light-emitting element and an inorganic light-emitting element.

8. A method of fabricating an oxide semiconductor thin-film transistor, comprising:
    forming a gate electrode on a substrate;
    forming a gate insulating layer on the gate electrode;
    forming an oxide semiconductor layer on the gate insulating layer; and
    forming source and drain electrodes on the gate insulating layer and the oxide semiconductor layer,
    wherein the forming of the gate insulating layer comprises forming the gate insulating layer using at least one of zirconium oxide (ZrOx) and lanthanum zirconium oxide (LaZrOx),
    wherein the forming of the gate insulating layer comprises forming the gate insulating layer using the lanthanum zirconium oxide (LaZrOx), and
    wherein lanthanum (La) is comprised in an amount of 2.5 at % to 7.5 at % in the lanthanum zirconium oxide (LaZrOx).

9. The method according to claim 8, wherein the forming of the gate insulating layer comprises forming the gate insulating layer to have a thickness of 0.19 nm to 0.35 nm according to a content of lanthanum (La) in the lanthanum zirconium oxide (LaZrOx).

* * * * *